United States Patent
Jung et al.

(10) Patent No.: US 12,300,965 B2
(45) Date of Patent: May 13, 2025

(54) QUANTUM CASCADE LASER DEVICES WITH IMPROVED HEAT EXTRACTION

(71) Applicant: TRANSWAVE PHOTONICS, LLC., Austin, TX (US)

(72) Inventors: Seungyong Jung, Cedar Park, TX (US); Mikhail A. Belkin, Munich (DE)

(73) Assignee: TRANSWAVE PHOTONICS, LLC., Austin, TX (US)

( * ) Notice: Subject to any disclaimer, the term of this patent is extended or adjusted under 35 U.S.C. 154(b) by 0 days.

(21) Appl. No.: 18/376,841

(22) Filed: Oct. 5, 2023

(65) Prior Publication Data

US 2024/0030679 A1 Jan. 25, 2024

Related U.S. Application Data

(62) Division of application No. 17/138,829, filed on Dec. 30, 2020, now abandoned.

(51) Int. Cl.
*H01S 5/02* (2006.01)
*G02B 6/12* (2006.01)
(Continued)

(52) U.S. Cl.
CPC .......... *H01S 5/02469* (2013.01); *G02B 6/12* (2013.01); *H01S 5/0201* (2013.01);
(Continued)

(58) Field of Classification Search
CPC ............. H01S 5/02469; H01S 5/0234; H01S 5/02355; H01S 5/0201; H01S 5/0217; H01S 5/3402; G02B 6/12
See application file for complete search history.

(56) References Cited

U.S. PATENT DOCUMENTS 6,791,181 B2 * 9/2004 Horie ............... H01S 5/024
257/E33.076
6,924,512 B2 * 8/2005 Tsuda ............... H01S 5/34333
257/97
(Continued)

FOREIGN PATENT DOCUMENTS

JP 2015-032797 A 2/2015

OTHER PUBLICATIONS

Andrijasevic et al., Hybrid integration of GaAs quantum cascade lasers with Si substrates by thermocompression bonding. Appl. Phys. Lett. Feb. 4, 2008; 92 (5): 051117. https://doi.org/10.1063/1.2841635 (Year: 2008).*

(Continued)

*Primary Examiner* — Peter Radkowski

(57) ABSTRACT

Structures and methods for reducing the thermal resistance of quantum cascade laser (QCL) devices and QCL-based photonic integrated circuits (QCL-PIC) are provided, wherein, in various embodiments, the native substrate of QCL and QCL-PIC devices is replaced with a foreign substrate that has very high thermal conductivity, for example, using wafer bonding methods. In some examples, wafer bonding of processed, semi-processed, or unprocessed QCL and QCL-PIC epilayers or devices on their native substrate to a high-thermal-conductivity substrate is performed, followed by removal of the native substrate via selective etching, and performing additional device processing if necessary. Thereafter, in some embodiments, cleaving or dicing individual devices from the bonded wafers may be performed, for example, for mounting onto heat sinks.

20 Claims, 18 Drawing Sheets

(51) Int. Cl.
  *H01S 5/0234* (2021.01)
  *H01S 5/02355* (2021.01)
  *H01S 5/024* (2006.01)
  *H01S 5/34* (2006.01)

(52) U.S. Cl.
  CPC .......... *H01S 5/0217* (2013.01); *H01S 5/0234* (2021.01); *H01S 5/02355* (2021.01); *H01S 5/3402* (2013.01)

(56) References Cited

U.S. PATENT DOCUMENTS

| | | | | |
|---|---|---|---|---|
| 8,759,812 | B2* | 6/2014 | Takagi | H01S 5/3402 |
| | | | | 257/14 |
| 8,805,147 | B2* | 8/2014 | Koyama | H01S 5/3402 |
| | | | | 385/132 |
| 8,993,999 | B2* | 3/2015 | Takagi | H01S 5/2275 |
| | | | | 257/E33.024 |
| 9,077,154 | B2* | 7/2015 | Takagi | H01S 5/2022 |
| 9,285,540 | B2* | 3/2016 | Bauters | G02B 6/1225 |
| 10,049,947 | B2* | 8/2018 | Lee | H01L 27/085 |
| 10,658,187 | B2* | 5/2020 | Oppermann | H01L 23/5383 |
| 10,718,491 | B1* | 7/2020 | Raring | H01S 5/062 |
| 10,840,110 | B2* | 11/2020 | Letowski | H01L 23/492 |
| 2002/0063329 | A1* | 5/2002 | Horie | H01S 5/024 |
| | | | | 257/E33.076 |
| 2003/0136957 | A1* | 7/2003 | Tsuda | B82Y 20/00 |
| | | | | 257/14 |
| 2007/0224721 | A1* | 9/2007 | Chuang | B82Y 20/00 |
| | | | | 438/57 |
| 2012/0181504 | A1* | 7/2012 | Takagi | H01S 5/2206 |
| | | | | 438/47 |
| 2012/0292512 | A1* | 11/2012 | Koyama | G02B 6/10 |
| | | | | 385/132 |
| 2014/0166983 | A1* | 6/2014 | Cohen | H01L 29/775 |
| | | | | 257/29 |
| 2014/0241389 | A1* | 8/2014 | Takagi | H01S 5/3218 |
| | | | | 372/45.01 |
| 2014/0241390 | A1* | 8/2014 | Takagi | H01S 5/2022 |
| | | | | 372/45.01 |
| 2015/0226918 | A1* | 8/2015 | Bauters | G02B 6/1228 |
| | | | | 438/31 |
| 2017/0200648 | A1* | 7/2017 | Lee | H01L 27/092 |
| 2019/0088490 | A1* | 3/2019 | Oppermann | H01L 23/5389 |
| 2019/0287817 | A1* | 9/2019 | Letowski | H01L 23/492 |

OTHER PUBLICATIONS

Nida et al Characterization of iron doped indium phosphide as a current blocking layer in buried heterostructure quantum cascade lasers. Journal of Applied Physics Mar. 7, 2017; 121 (9): 094502. https://doi.org/10.1063/1.4977243 (Year: 2015).*

Lee et al., Monolithic Integration of Si-CMOS and III-V-on-Si Through Direct Wafer Bonding Process, Journal of the Electron Devices Society, V. 6, 2018 (Year: 2018).*

J.Faist, F. Capasso, D.L. Sivco, C. Sirtori, A.L. Hutchinson, and A.Y. Cho, "Quantum Cascade Laser," Science 264, 553-556 (1994).

M. Beck, D. Hofstetter, T. Aellen, J_ Faist, U. Oesterle, M. Ilegems, E. Gini, and H. Melchior, "Continuous Wave Operation of a Mid-Infrared Semiconductor Laser at Room Temperature," Science 295, 301-305 (2002).

S. Jung, D. Palaferri, K. Zhang, F. Xie, Y. Okuno, C. Pinzone, K. Lascola, and M.A. Belkin, "Homogeneous photonic Integration of mid-infrared quantum cascade lasers with low-loss passive waveguides on an InP platform," Optica vol. 5, No. 8, 1023-1030 (2019).

S.C. Chaparala, F. Xie, C. Caneau, C.E. Zah, and L.C. Hughes, "Design Guidelines for Efficient Thermal Management of Mid-Infrared Quantum Cascade Lasers," IEEE Trans. on Components, Packaging and Manufacturing Technology vol. 1, No. 12, 1975-1982 (2011).

Benjamin S. Williams, Sushil Kumar, Hans Callebaut, Qing Hu, and John L. Reno, "Terahertz quantum-cascade laser at $\lambda \approx 100$ μm using metal waveguide for mode confinement" Appl. Phys. Lett. vol. 83, No. 11, 2124-2126, (2003).

* cited by examiner

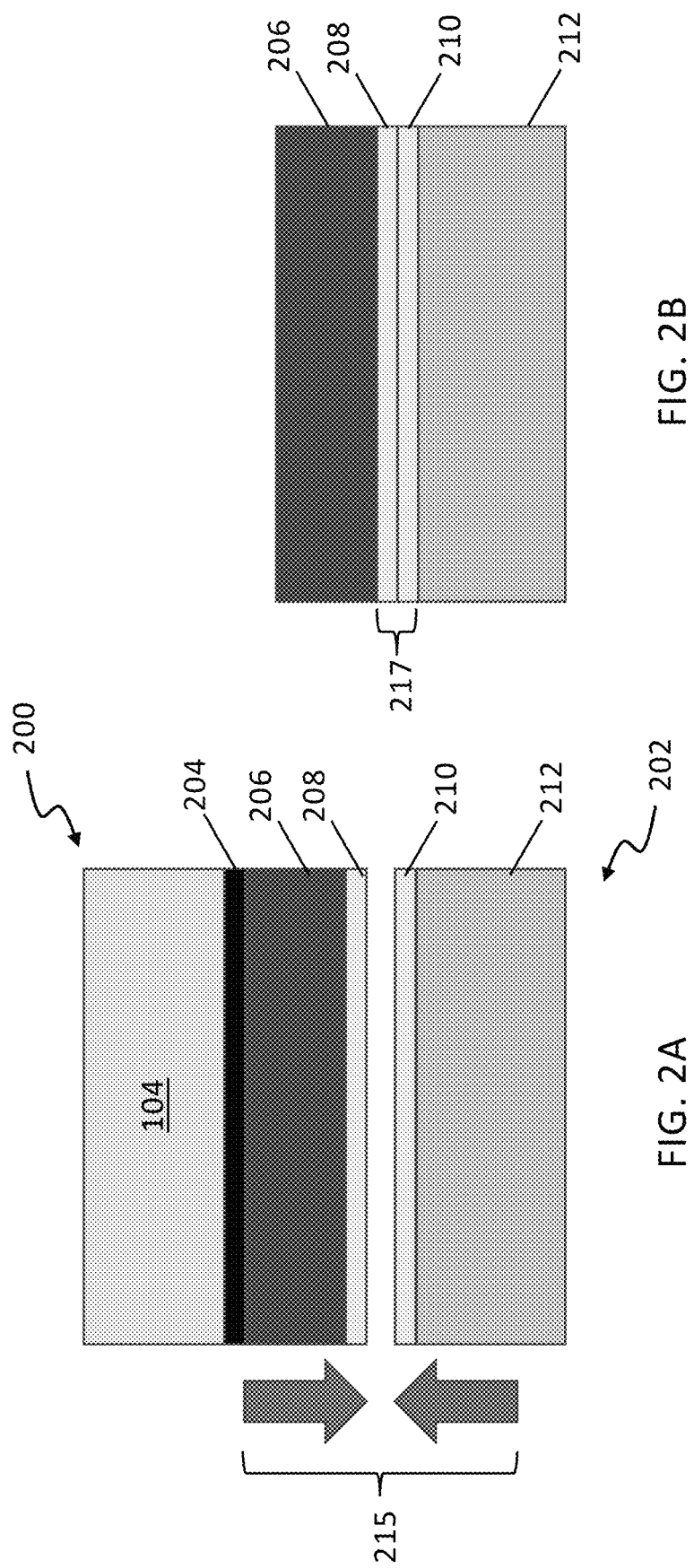

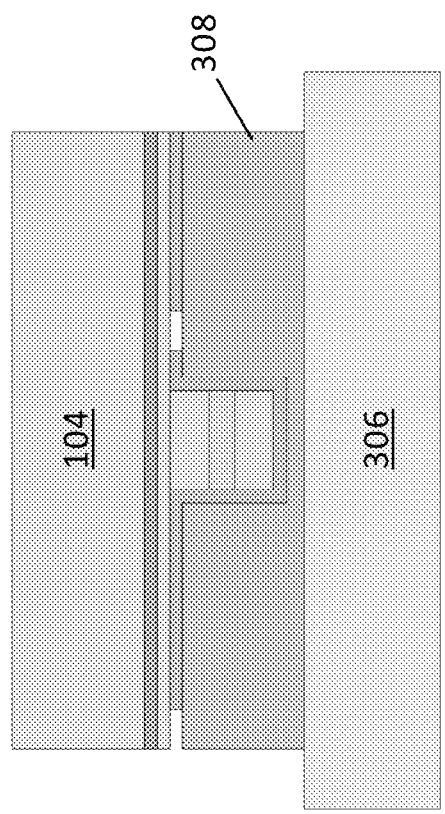
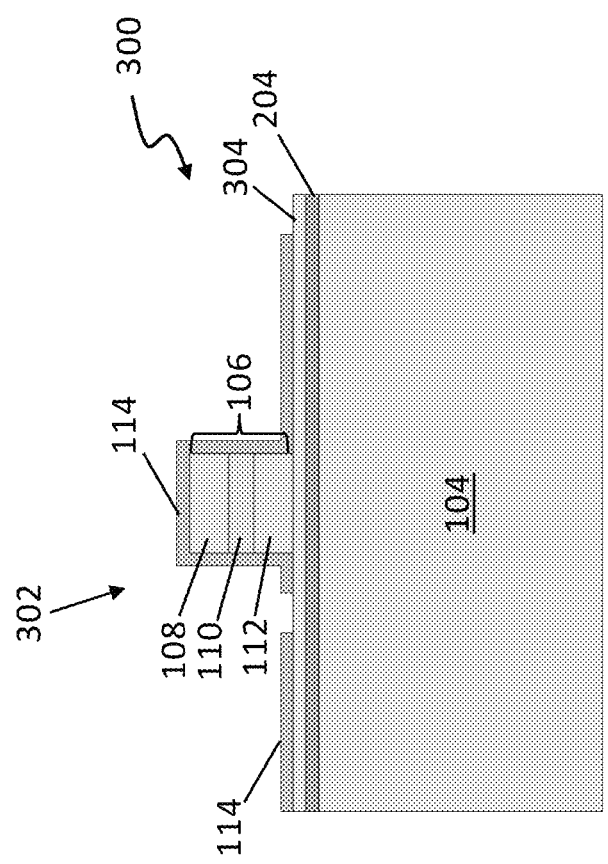

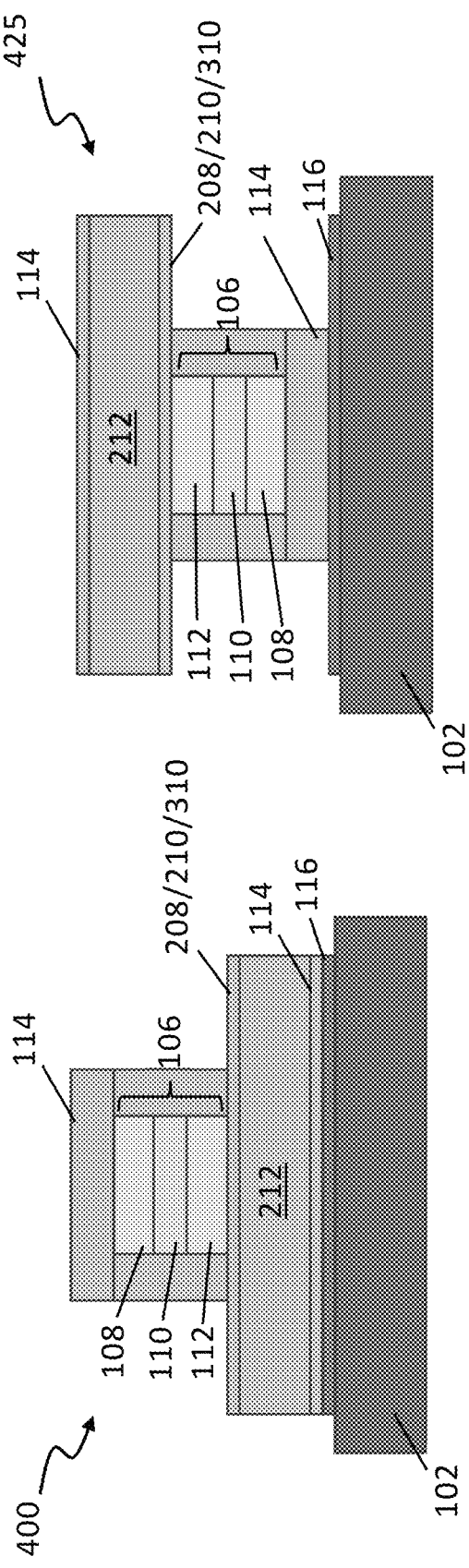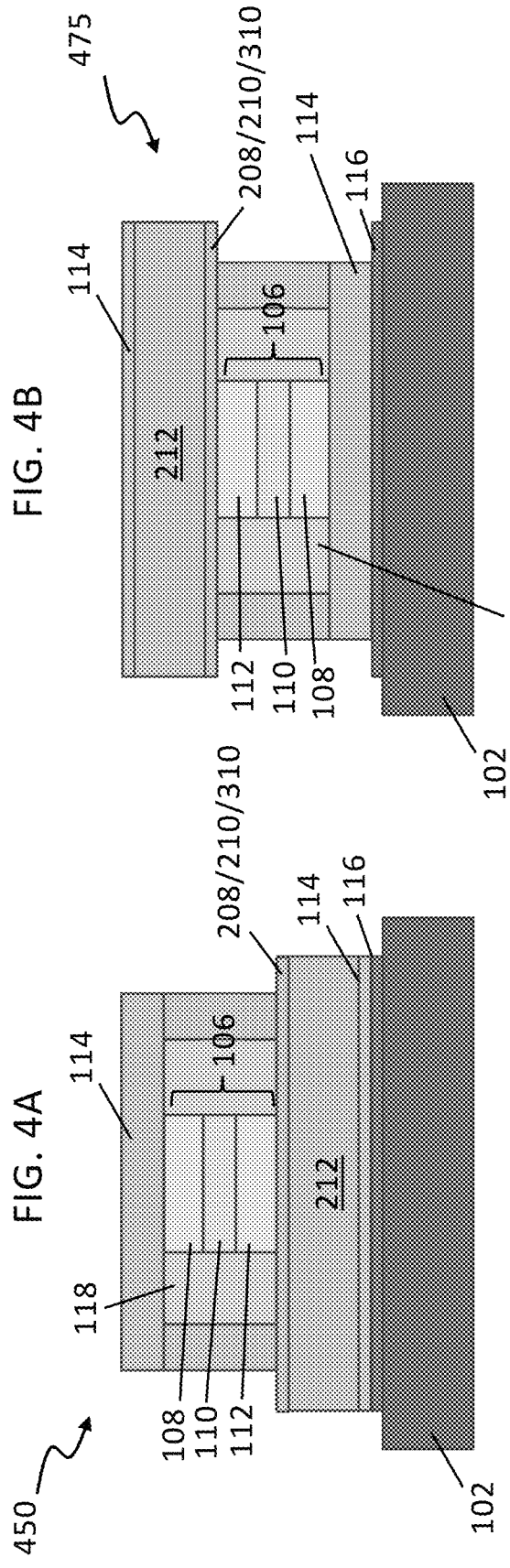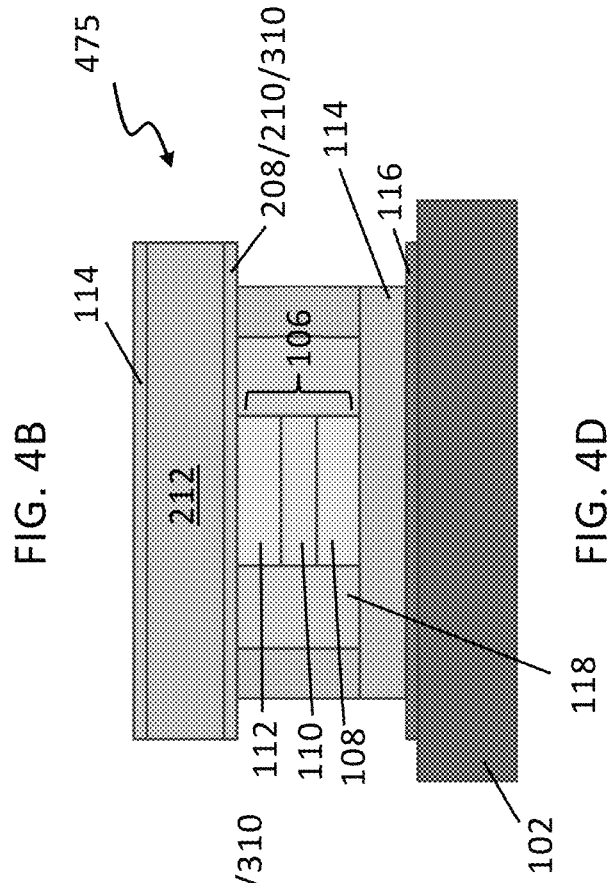

| Exemplary Embodiment | Substrate type | | Epi-layer condition | | | Bias scheme |
|---|---|---|---|---|---|---|
| | Thermally conductive | Electrically conductive | Non processed | Partially processed | Fully processed | |
| 1 | v | | v | | | Side injection |
| 2 | v | | | v | | Side injection |
| 3 | v | | | | v | Side injection |
| 4 | v | v | v | | | Side injection, top-bottom injection |
| 5 | v | v | | v | | Side injection, top-bottom injection |
| 6 | v | v | | | v | Side injection, top-bottom injection |

FIG. 9

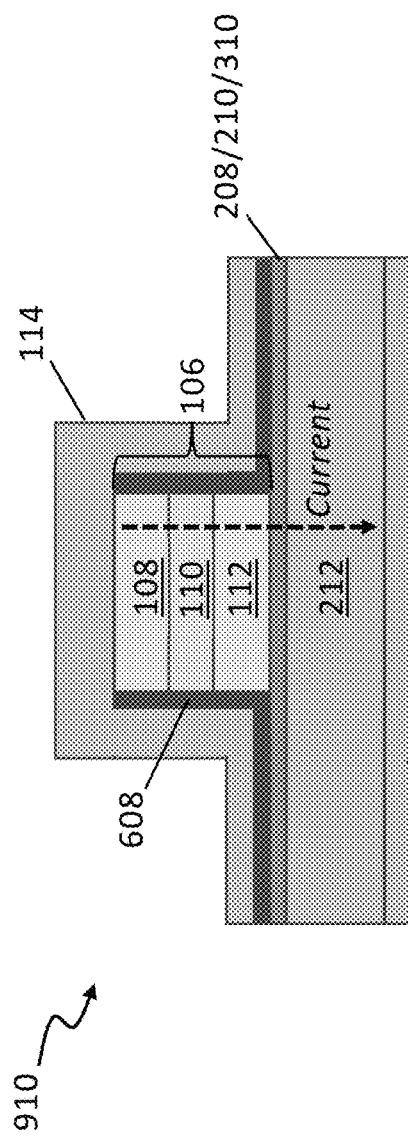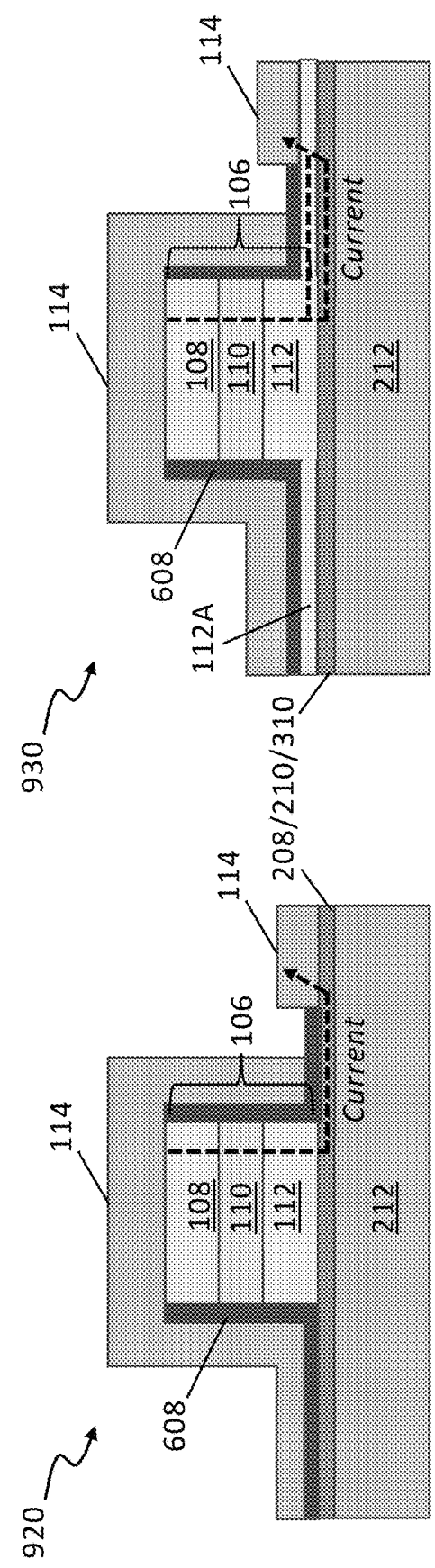

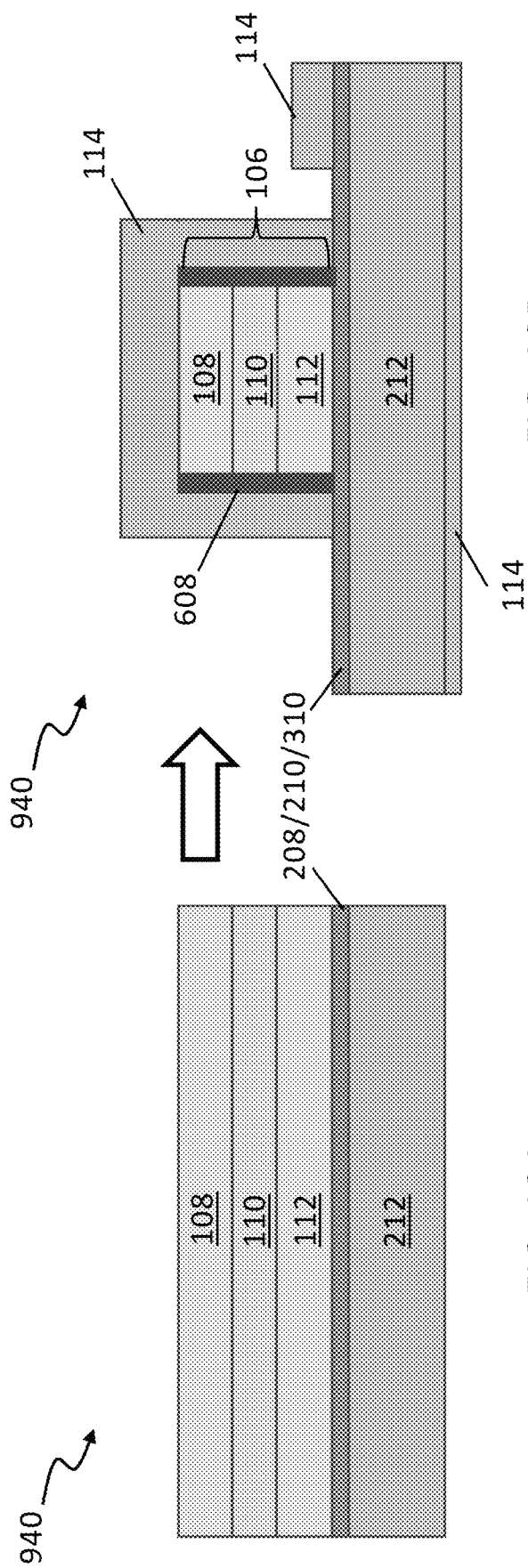

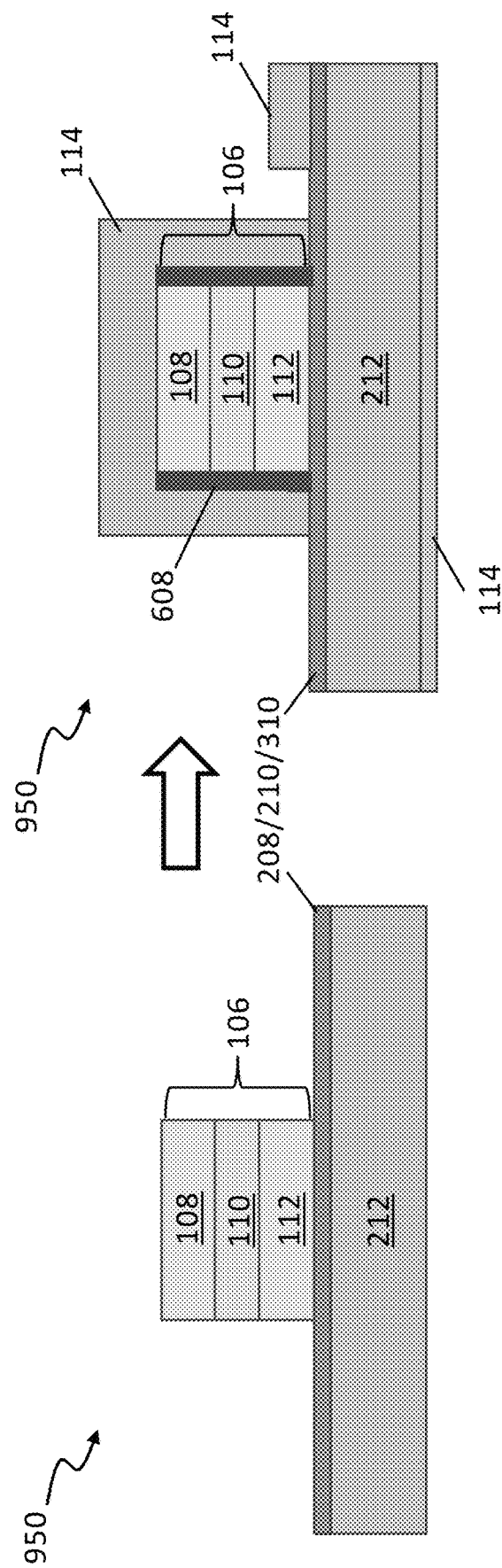

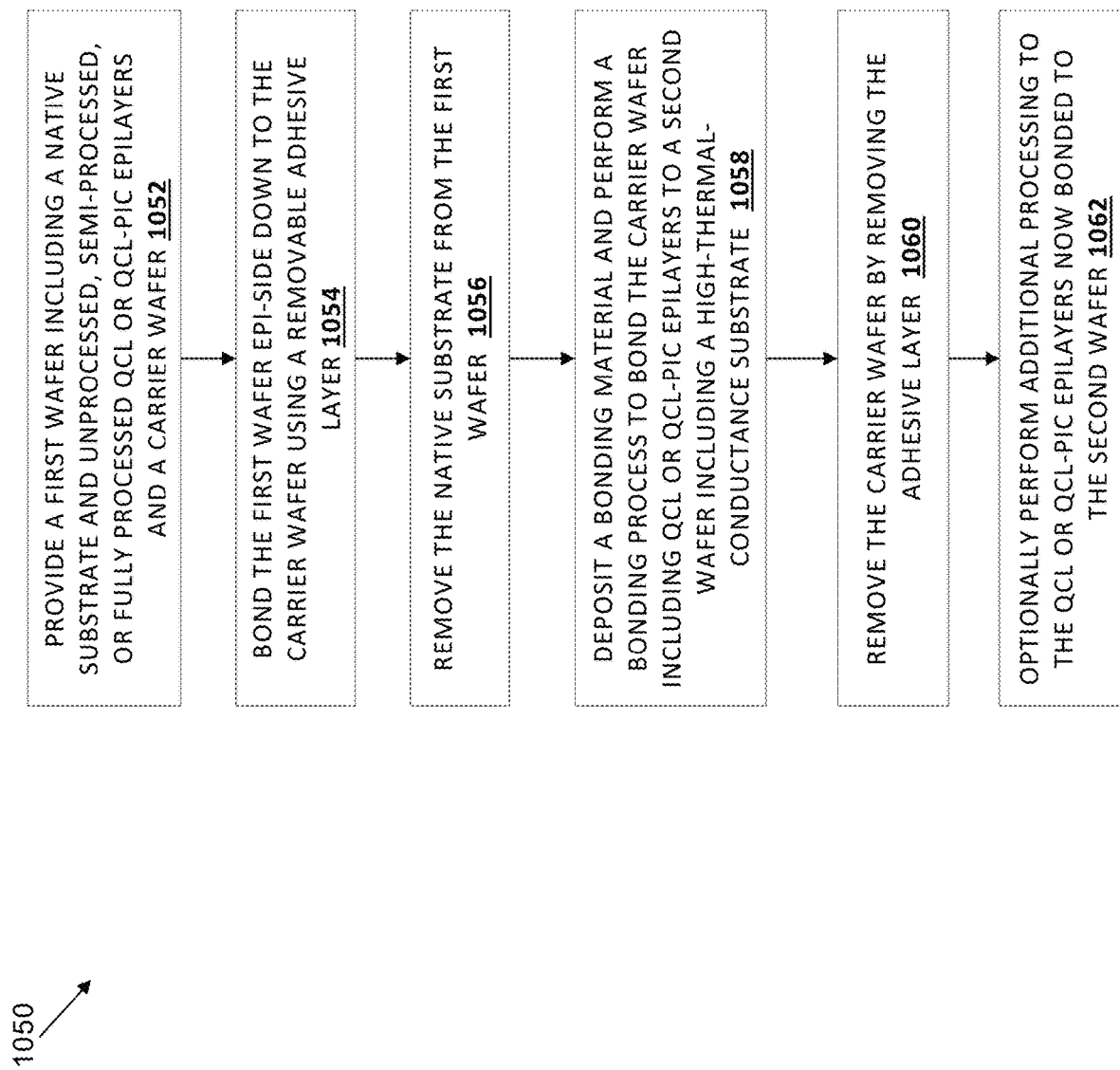

QUANTUM CASCADE LASER DEVICES WITH IMPROVED HEAT EXTRACTION

CROSS-REFERENCE TO RELATED APPLICATIONS

This application is a division of U.S. patent application Ser. No. 17/138,829, filed Dec. 30, 2020, the entirety of which is incorporated by reference herein.

BACKGROUND

Mid-infrared (mid-IR, $\lambda \approx 3\text{-}20$ μm) quantum cascade lasers (QCLs) and QCL-based photonic integrated circuits (PICs) are of great interest for a wide range of mid-infrared applications. QCL-based PICs may transform many traditional mid-IR free-space instruments based on discrete optical components into compact, mass-producible, chip-scale devices where all active and passive devices are combined onto a single chip. With respect to mid-IR light sources, QCLs are currently the only electrically-pumped semiconductor light sources that can provide continuous-wave (CW) operation at room temperature in most of the mid-IR spectral range and, with cooling, across the entire mid-IR spectral range.

A homogeneously-grown QCL-based photonic integrated circuit (QCL-PIC) consists of layers made of QCL material and layers made of passive or active photonic waveguide material grown on top of a common substrate. QCLs and QCL-PICs can be grown using different semiconductor materials and substrates. However, the substrates and material systems used to fabricate QCLs and QCL-PICs generally have much lower thermal conductivity than that of other available crystalline wafer materials. In addition, unlike diode lasers, QCLs operating in the mid-IR spectral range at room temperature have very high threshold power densities, which makes thermal management in QCLs and QCL-PICs extremely important as the dissipated heat of the device is trapped in the QCL active region which limits the devices performance and adversely affects their reliability and lifetime.

In at least some existing implementations, an epi-down mounting process may be used to put a QCL laser ridge in direct contact with a sub-mount or a heat sink with high thermal conductivity. However, epi-down mounting is a complicated, low-throughput, low-yield process.

Thus, existing techniques for QCL thermal management have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B illustrate a schematic view of a top-epilayer-down transfer method, in accordance with some embodiments;

FIGS. 3A, 3B, 3C, 3D, and 3E, illustrate a schematic view of a top-epilayer-up transfer method, in accordance with some embodiments;

FIG. 4A illustrates an epi-up mounted ridge-waveguide QCL device on a foreign substrate, in accordance with some embodiments;

FIG. 4B illustrates an epi-down mounted ridge-waveguide QCL device on a foreign substrate, in accordance with some embodiments;

FIG. 4C illustrates an epi-up BH waveguide device on a foreign substrate, in accordance with some embodiments;

FIG. 4D illustrates an epi-down BH waveguide device on a foreign substrate, in accordance with some embodiments;

FIG. 9 shows a table illustrating various combinations of substrate type, epi-layer condition, and bias scheme for QCL devices that may be fabricated in accordance with various embodiments;

FIGS. 10, 11A, and 11B illustrate QCL devices on foreign substrates and having various biasing schemes, in accordance with some embodiments;

FIGS. 12A/12B illustrate a method of fabricating a QCL device that includes wafer bonding of unprocessed epilayers to a foreign substrate, in accordance with some embodiments;

FIGS. 13A/13B illustrate wafer bonding of semi-processed or fully processed epilayers or devices to a foreign substrate, in accordance with some embodiments;

FIG. 15 is a flow chart of another method of fabricating a QCL and/or QCL-PIC device, according to one or more aspects of the present disclosure.

DETAILED DESCRIPTION

Figure 1A:
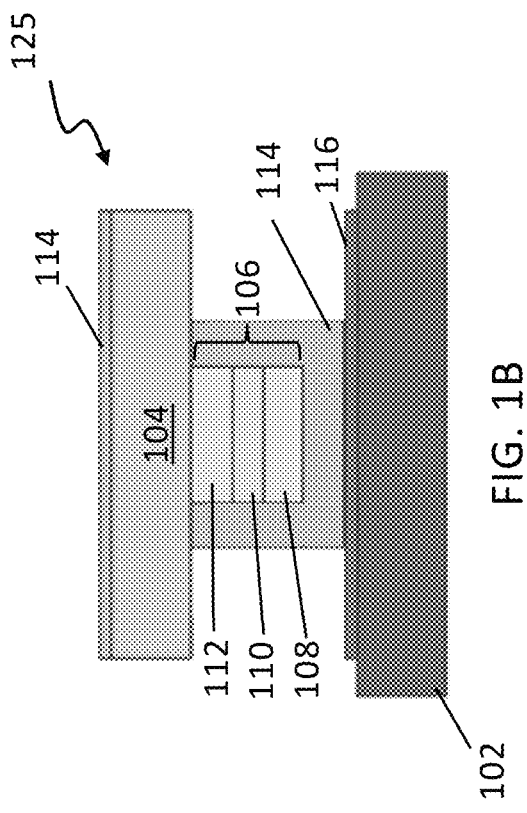
FIG. 1A illustrates an epi-up mounted ridge-waveguide QCL device on a native substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A quantum cascade laser (QCL) is a semiconductor laser producing light based on intersubband transition in an active region consisting of many thin layers of quantum well and barrier materials that form a so-called superlattice. QCLs are presently the only electrically-pumped semiconductor light sources that can provide continuous-wave (CW) operation at room temperature across most of the mid-IR spectral range and, with cooling, across the entire mid-IR spectral range. As such, mid-infrared (mid-IR, $\lambda \approx 3\text{-}20$ μm) photonic integrated circuits (PICs), employing QCLs as the mid-IR light source, are of great interest for a wide range of mid-infrared applications.

A homogeneously-grown QCL-based photonic integrated circuit (QCL-PIC) consists of layers made of QCL material and layers made of passive or active photonic waveguide material grown on top of a common substrate. QCLs and QCL-PICs can be grown using different semiconductor materials and substrates. For example, some QCLs and QCL-PICs can be produced using layers of InGaAs and AlInAs ternaries as well as InAs, AlAs, and InP binaries grown on a common InP substrate. Most often, devices may be made of GaInAs/AlInAs/InP heterostructures grown on InP substrates, GaAs/AlGaAs heterostructures grown on GaAs substrates, and InAs/AlSb heterostructures grown on GaSb or InAs or, more recently, on Si. The superlattice nature of the QCL active region adversely decreases its thermal conductivity that also becomes significantly anisotropic. For example, the thermal conductivity is ~1-2 W/mK for the transverse direction (perpendicular to the growth plane) and ~4-8 W/mK for the lateral direction (parallel to the growth plane) for typical InGaAs/AlInAs/InP QCLs. These values are much lower than typical values of other available crystalline wafer materials, such as silicon carbide (SiC), aluminum nitride (AlN), diamond, or beryllium oxide (BeO). In particular, the room-temperature thermal conductivity of InP, GaAs, GaSb, InAs, and Si are, respectively, approximately 70 W/(m·K), approximately 55 W/(m·K), approximately 32 W/(m·K), approximately 27 W/(m·K), and approximately 130 W/(m·K). Thermal conductivities of the QCL heterostructures are lower than that of their substrates. In comparison, high-thermal-conductivity materials, such as SiC, AlN, diamond, BeO, or copper have values of thermal conductivity well above 250 W/m·K. In some embodiments, the thermal conductivity of SiC, AlN, diamond, BeO, and Cu are, respectively, approximately 490 W/(m·K), approximately 285 W/(m·K), greater than 1,000 W/(m·K), approximately 325 W/(m·K), and approximately 400 W/(m·K). Generally, the thermal conductivities of SiC, AlN, diamond, BeO, and Cu can all exceed 150 W/(m·K) and can be as high as approximately 2200 W/(m·K) for high-quality diamond or as high as approximately 500 W/(m·K) for high-quality SiC substrates. Based on the above, and in accordance with various embodiments, it may be further stated that the high-thermal-conductivity material, or high-thermal-conductivity substrate, may include a material or substrate having a thermal conductivity at least greater than that of Si.

In addition, unlike diode lasers, QCLs operating in the mid-infrared spectral range at room temperature have very high threshold power densities (e.g., typically in excess of 10 kW/cm$^2$). This property makes thermal management in QCLs and QCL-PICs extremely important as the dissipated heat of the device is trapped in the active region which limits the devices performance and adversely affects their reliability and lifetime. Typical active region temperatures of QCLs operating in continuous-wave (CW) regime can range from 20-50° K higher than their heatsink temperature for well-thermally-packaged devices to more than 100° K higher than their heat sink temperature for devices that are not well thermally packaged.

In at least some existing implementations, arrays of multiple QCL or QCL-PIC devices are processed on their native substrates, then the substrates are cleaved or diced into individual devices, and then the individual devices are mounted either onto suitable high-thermal-conductivity sub-mounts attached to heat sinks or directly to heat sinks. In general, thermal resistance of QCLs mounted onto heat sinks can be improved by maximizing heat conduction between the QCL active region and the sub-mount or the heat sink. The sub-mount and heat sink has high thermal conductivity and is regulated by an active temperature controller. To improve the heat conduction between a QCL device and its sub-mount or heat sink, one must consider using highly thermally conductive intermediate materials between the QCL active region and a sub-mount or a heat sink and minimizing the thickness of these materials to reduce their thermal resistance. For this purpose, an epitaxial-side-down (epi-down) mounting configuration, as shown in FIGS. 1B/1D, may be used to put a QCL laser ridge in direct contact with a sub-mount or a heat sink, including sub-mounts made of diamond or AlN. The epi-down mounting configuration is in contrast to an epitaxial-side-up (epi-up) mounting configuration, as shown in FIGS. 1A/1C, where the device substrate, which has relatively low thermal conductivity and a thickness of about 150-200 μm, makes direct contact to a sub-mount or a heat sink.

Figure 1B:
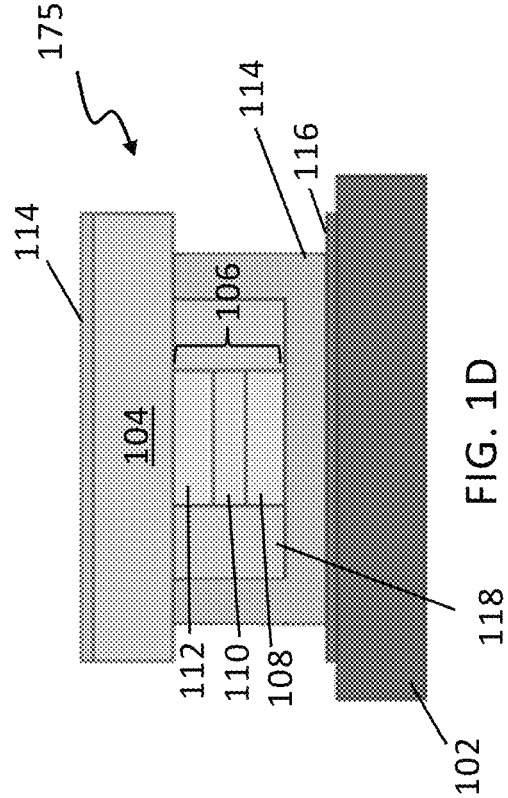
FIG. 1B illustrates an epi-down mounted ridge-waveguide QCL device on a native substrate.
Figure 1C:
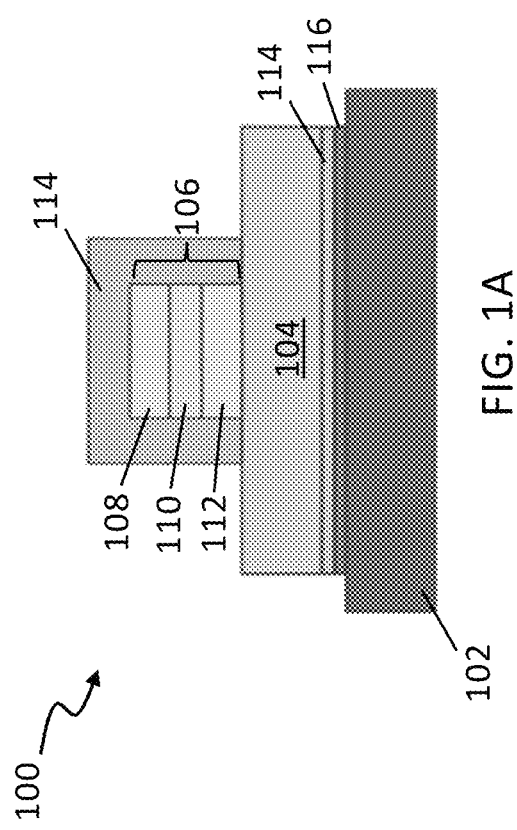
FIG. 1C illustrates an epi-up buried-heterostructure (BH) waveguide device on a native substrate.
Figure 1D:
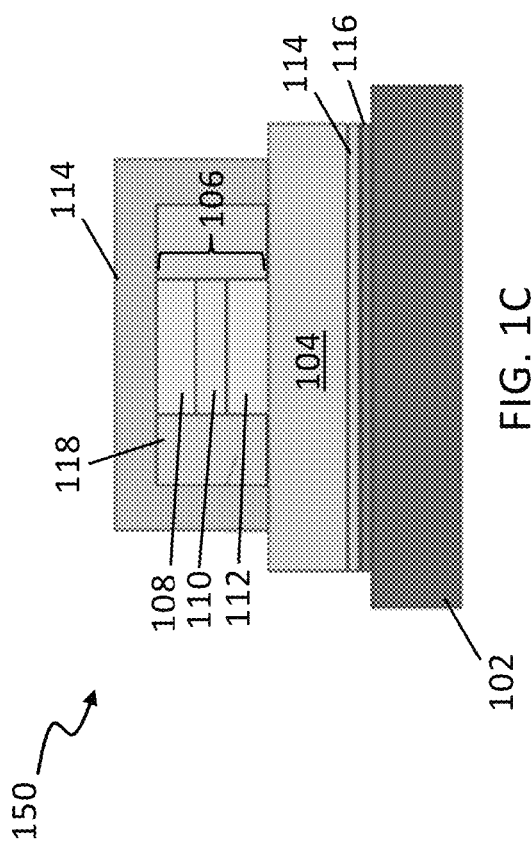
FIG. 1D illustrates an epi-down BH waveguide device on a native substrate.

Elaborating on the above, FIG. 1A illustrates an epi-up mounted ridge-waveguide QCL device 100, FIG. 1B illustrates an epi-down mounted ridge-waveguide QCL device 125, FIG. 1C illustrates an epi-up buried-heterostructure (BH) waveguide device 150, and FIG. 1D illustrates an epi-down BH waveguide device 175. BH waveguide processing is often used to further reduce QCL waveguide loss and thermal resistance in comparison with ridge-waveguide QCL devices. As shown in the examples of FIGS. 1A-1D, each of the devices 100, 125, 150, 175 include a substrate 104. In some embodiments, the substrate 104 includes a doped InP substrate, upon which various epitaxial QCL layers, and in some cases passive waveguide layers, are formed using a metal-organic vapor phase epitaxy (MOVPE) process, a metal-organic chemical vapor deposition (MOCVD) process, a molecular beam epitaxy (MBE) process, or other suitable epitaxial semiconductor growth process. As discussed further below, the substrate 104 may be referred to as a "native substrate", and in accordance with various embodiments, may be replaced with a foreign substrate that has very high thermal conductivity. In various embodiments, the foreign substrate may include one of the high-thermal-conductivity materials, discussed above.

In some examples, the devices 100, 125, 150, 175 further include a QCL heterostructure 106 formed over the substrate 104. In some cases, the QCL heterostructure 106 may optionally be formed over a passive waveguide heterostructure that interposes the QCL heterostructure 106 and the substrate 104 to fabricate QCL-PIC devices. In some cases, the passive waveguide heterostructure may be formed on top of the QCL cladding layer 108 to fabricate QCL-PIC devices. The passive waveguide heterostructure, by way of example, may include any of a plurality of material systems configured to guide light along a particular direction, for example, by utilizing a waveguide core layer surrounded by cladding layers having a lower index of refraction than the waveguide core layer. The QCL heterostructure 106 may include a lower cladding layer 112, a QCL active region 110 (providing QCL gain) formed over the lower cladding layer 112, and an upper cladding layer 108 formed over the QCL active region 110. In some embodiments, a lower confinement layer may be disposed between the QCL active region 110 and the lower cladding layer 112, and an upper confinement layer may be disposed between the QCL active region 110 and the upper cladding layer 108. The lower confinement layer and the upper confinement layer, in some examples, provide high refractive index layers around the QCL active region 110 to enable efficient lasing operation of the devices 100, 125, 150, 175.

In some embodiments, the lower cladding layer 112 includes an InP lower cladding layer (e.g., doped with Si). The QCL active region 110, in some examples, is composed of a plurality (e.g., 30) of lattice-matched or strain-compensated InGaAs/AlInAs QCL stage layers configured to provide an emission wavelength in the mid-IR range. In some cases, the upper cladding layer 108 includes an InP upper cladding layer (e.g., doped with Si). In various examples, the lower confinement layer and the upper confinement layer (if present) may include an $In_{0.53}Ga_{0.47}As$ layer. In some embodiments, the lower confinement layer and the upper confinement layer (if present) may have substantially the same refractive index, and a larger refractive index than the QCL active region 110.

In some examples, the devices 100, 125, 150, 175 may further include a current injection layer (e.g., such as $In_{0.53}Ga_{0.47}As$) optionally formed between the substrate 104 and the lower cladding layer 112. In some embodiments, the devices 100, 125, 150, 175 may also include a silicon nitride layer disposed along sidewalls of the QCL heterostructure 106 to provide electrical insulation. In some cases, an outer cladding layer and a contact layer may also be formed, for example, over the upper cladding layer 108. When included, the outer cladding layer may include an InP outer cladding layer, and the contact layer may include an InP layer or $In_{0.53}Ga_{0.47}As$ layer formed over the outer cladding layer. In addition, each of the devices 100, 125, 150, 175 may include one or more metal layers 114 (e.g., such as Ti/Au) that may be used to form a top contact, a bottom contact, and a side contact (e.g., for embodiments including the optional current injection layer).

With respect to the BH devices, the epi-up BH device 150 and the epi-down BH device 175 may additionally include a cladding layer on either side of the QCL heterostructure 106. For example, the devices 150, 175 may include an Fe-doped InP cladding layer 118 on either side of the QCL heterostructure 106 (including over opposing sidewalls of the QCL heterostructure 106).

As illustrated, each of the devices 100, 125, 150, 175 may be mounted, in their respective epi-up (devices 100, 150) or epi-down (devices 125, 175) mounting configurations, on a copper block 102 using a bonding solder 116. In some cases, the bonding solder 116 may include indium solder or gold-tin. The epi-down mounting configuration, in some examples, may be used to improve the heat conduction between the QCL devices 125, 175 and the copper block 102 by minimizing a distance between the QCL active region 110 and the copper block 102 (e.g., by the flip-chip bonding nature of the epi-down mounting process), as compared to the epi-up QCL devices 100, 150.

Although frequently employed in high-power CW QCL devices, the epi-down mounting configuration is a complicated, low-throughput, and low-yield process. Each laser or each laser bar has to be carefully attached to a sub-mount or a heatsink with a thin layer of bonding solder. Such a process cannot be performed at the wafer-level. Further, since the QCL laser ridge is in contact with its sub-mount or heat sink through the bonding solder, a mismatch of thermal expansion coefficients between QCL materials, the sub-mount or heat sink, and the bonding solder produces significant mechanical stress on the QCL epitaxial layers (epilayers), often leading to device failure. Thus, careful selection of the die bonding solder is critical. In addition, the bonding solder often covers the facet of the QCL during the epi-down mounting process, short-circuiting the device. Furthermore, the epi-down mounting process becomes more challenging and problematic for the development of an addressable QCL array, where each array element should have an independent electrical contact for individual biasing. Moreover, for a QCL-PIC device where there are many other devices integrated monolithically, an epi-down mounting process could be problematic and high risk, at least because the epi-down mounting of a particular element while keeping other elements intact is highly challenging. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for reducing the thermal resistance of QCL and QCL-PIC devices, for example, by improving the vertical heat extraction of such devices. In some embodiments, the native substrate of QCL and QCL-PIC devices is replaced with a foreign substrate that has very high thermal conductivity. In accordance with various embodiments, the foreign substrate has a thermal conductivity greater than the native substrate. More generally, the foreign substrate may have a thermal conductivity at least greater than that of Si, with as noted above is approximately 130 W/(m·K). The native substrate may be replaced with the foreign substrate by using wafer bonding methods. For example, in various embodiments, the disclosed methods include first performing wafer bonding of processed, semi-processed, or unprocessed QCL and QCL-PIC epilayers or devices on their native substrates to high-thermal-conductivity substrates (a "foreign substrate") followed by removal of their native substrate via selective etching, performing additional device processing if necessary (e.g., in the case of unprocessed wafers or semi-processed devices), and cleaving or dicing individual devices from the bonded wafers for mounting onto heat sinks. By way of example, the disclosed methods may be contrasted to at least some existing methods of first dicing or cleaving individual devices, such as processed lasers, laser bars, or QCL-PIC pieces, processed on their native substrates, and then mounting them individually on high-thermal-conductivity sub-mounts. In addition, because the native substrate is replaced by the high thermal conductivity substrate and in accordance with various embodiments, the active region temperature of a QCL or QCL-PIC device (e.g., during operation in the CW regime) may be substantially the same as the heat sink (regulated by a temperature controller) onto which they are mounted, in contrast to at least some existing implementations.

In accordance with various embodiments, the high thermal conductivity foreign substrate should have a very good thermal contact with the QCL or QCL-PIC devices. This can be achieved, for example, by using metal-metal thermocompression bonding of the QCL (or QCL-PIC) wafer and the foreign substrate wafer. As discussed below, metal materials used for the metal-metal thermocompression bonding process may include gold (Au), a Au-containing material layer such as titanium/gold (Ti/Au) or titanium/platinum/gold (Ti/Pt/Au), copper (Cu), or a Cu-containing material layer. It is noted, however, that wafer bonding methods other than thermocompression metal-metal bonding may potentially be used, without departing from the scope of the present disclosure. For example, in some embodiments, wafer bonding may be achieved by using a thermally and electrically conductive epoxy such as sintered silver epoxy. In various examples, as discussed below, the transfer of the QCL or QCL-PIC epilayers onto the high-thermal-conductivity foreign substrates may be performed so that, at the end of the transfer, the top epilayer (e.g., such as the upper cladding layer 108, discussed above) faces the foreign substrate or in a way that the top epilayer remains on top when transferred onto the foreign substrate. It is further noted that the epi-transfer methods shown and described with reference to the various figures are not meant to be limiting in any way, and other epi-transfer methods onto high-thermal-conductivity substrates may be equally employed, without departing from the scope of this disclosure.

In some embodiments, the foreign substrate (onto which the QCL and QCL-PIC epilayers or devices are transferred) may include SiC. SiC offers high thermal conductivity, low electrical resistivity, and a small mismatch of thermal expansion coefficient (CTE) to InP, which can significantly reduce device mechanical stress. More generally, and in some embodiments, the CTE of the high-thermal-conductivity foreign substrate and the CTE of the native QCL substrate (e.g., such as InP) may be within +/−10% of each other. In some examples, the SiC used as the foreign substrate may include various polytypes of SiC such as 2H—SiC, 4H—SiC, or 6H—SiC. In some embodiments, the SiC used as the foreign substrate may include may include undoped SiC, where a dopant species is not intentionally introduced into the SiC and/or the SiC has an insignificant amount of a dopant species present. In some cases, the SiC used as the foreign substrate may include doped SiC. For example, the doped SiC may include an N-type doped SiC substrate (e.g., doped with nitrogen), or the doped SiC may include a P-type doped SiC substrate (e.g., doped with aluminum). In some alternative embodiments, the foreign substrate may include diamond or AlN, both of which have an even higher thermal conductivity than SiC, as well as other materials with high-thermal conductivity such as BeO. More generally, and in various embodiments, the foreign substrate may include a thermally conductive substrate having a thermal conductivity equal to or greater than that of SiC. In some examples, thermal simulation results show that an epi-up mounted QCL device bonded on SiC can exhibit thermal resistance similar to or better than that of an epi-down-mounted QCL device on the native InP substrate. Stated another way, epi-up mounted QCL devices bonded onto high-thermal-conductivity substrates may be equivalently thought of as being similar to conventional epi-down mounted QCL devices. Thus, since epi-up mounted QCL devices bonded onto high-thermal-conductivity substrates offer performance that is equivalent to, or better than, epi-down mounted devices, the device complexity of epi-down mounting can be avoided, and manufacturing yield can be significantly increased. While some exemplary embodiments and advantages have been discussed above, these examples are not intended to be limiting beyond what is specifically recited in the claims that follow. Further, it will be understood that other embodiments and advantages will be evident to those skilled in the art upon reading the present disclosure.

With reference now to FIGS. 2A and 2B, illustrated therein is a schematic view of a top-epilayer-down transfer method. In accordance with various embodiments, the top-epilayer-down transfer method may be used to transfer unprocessed, semi-processed, or fully-processed QCL or QCL-PIC epilayers or devices onto a high-thermal-conductivity foreign substrate. In the present example, a QCL (or QCL-PIC) wafer 200 includes the native substrate 104, as described above, as well as an etch stop layer 204 (having a lower etch rate than the native substrate 104), QCL or QCL-PIC epilayers 206, and a bonding material 208. Although schematically illustrated as unpatterned, it will be understood that the QCL or QCL-PIC epilayers 206 may include unprocessed, semi-processed, or fully-processed QCL or QCL-PIC epilayers or devices. As also shown in this example, a foreign substrate wafer 202 includes a high-thermal-conductivity foreign substrate 212 and a bonding material 210. In various examples, the foreign substrate 212 may include at least one of the high-thermal-conductivity foreign substrate, as described above, such as SiC, diamond, AlN, BeO, or other high-thermal-conductivity substrate. In some embodiments, the bonding materials 208, 210 may each include Au or a Au-containing material layer such as Ti/Au or Ti/Pt/Au. In at least some embodiments, the bonding materials 208, 210 may include Cu or a Cu-containing material layer. This method is similar to that used to form double-metal waveguides in QCLs operating in the terahertz spectral range (frequencies 0.3-10 THz), for example, as described by Williams et al. ("Terahertz quantum-cascade laser at λ≈100 μm using metal waveguide for mode confinement", Appl. Phys. Lett. 83, 2124-2126, 2003), the contents of which are incorporated by reference herein. However, unlike the processing of double-metal waveguide THz QCLs, the foreign substrate 212 described herein has thermal conductivity significantly exceeding that of available native substrates of QCLs and the metal used for wafer bonding is separated from the optical mode of the laser by cladding layers 108 or 112 and thus is not playing a role in the light waveguiding.

In the illustrated top-epilayer-down transfer method, the QCL (or QCL-PIC) wafer 200 is oriented face-down so that the top epilayer of the QCL or QCL-PIC epilayers 206 remains closest to the foreign substrate 212 after the transfer process. Stated another way, the top-epilayer-down transfer is achieved by wafer bonding of the QCL (or QCL-PIC) wafer 200 (including unprocessed, semi-processed, or fully-processed QCL or QCL-PIC epilayers or devices) onto the high-thermal-conductivity foreign substrate 212 with the epi-side-down configuration as shown in FIG. 2A. In the present example, the wafer bonding of the QCL (or QCL-PIC) wafer 200 to the foreign substrate wafer 202 may be performed using a thermo-compression metal-metal bonding process 215, where both of the bonding materials 208, 210 are composed of Au or a Au-containing material layer (e.g., such as Ti/Au or Ti/Pt/Au). Thus, in some examples, both of the bonding materials 208, 210 may be composed of the same material. Alternatively, in some cases, both of the bonding materials 208, 210 are composed of Cu or a Cu-containing material layer. By way of example, the thermo-compression metal-metal bonding process 215 is accomplished by the simultaneous application of a compression force and heat, resulting in a metallurgical bond 217 between the QCL (or QCL-PIC) wafer 200 and the foreign substrate wafer 202. In some embodiments, the thermo-compression metal-metal bonding process 215, discussed above, may be performed as a wafer-level (e.g., in contrast to die-level) epilayer-down bonding process since the bonding may be performed prior to cleaving or dicing of individual die, and with the QCL or QCL-PIC epilayers 206 face-down on the foreign substrate 212. Following the bonding process 215, and in some embodiments, the native substrate 104 of the QCL (or QCL-PIC) wafer 200 is removed, as shown in FIG. 2B, by using a selective etchant that exhibits significantly different etch rates for different semiconductor materials. In the present example, the etch stop layer 204 (disposed between the native substrate 104 and the QCL or QCL-PIC epilayers 206) may have a substantially slower etch rate for the selective etchant, as compared to the native substrate 104, thereby providing for the selective removal of the native substrate 104 using the selective etchant.

It is noted that in the top-epilayer-down transfer method FIGS. 2A/2B, described above, the bonding materials 208, 210 are optional. For example, in some embodiments, a direct wafer bonding of the QCL (or QCL-PIC) wafer 200 to the foreign substrate wafer 202, without using any metal bonding material, may also be possible. For example, in some embodiments, an oxide layer may be formed on a QCL epilayer mounted to its native substrate and on a foreign substrate (e.g., such as a mirror-like foreign substrate), after which the oxide layers on each of the QCL epilayer and the foreign substrate are brought into contact to facilitate intermolecular interaction by covalent bonding or van der Waals force (e.g., with assistance of plasma or surface activation processes), Further, in at least some embodiments, the selective removal of the native substrate 104 using the selective etchant may or may not remove the etch stop layer 204.

Referring to FIGS. 3A-3E, illustrated therein is a schematic view of a top-epilayer-up transfer method. Like the top-epilayer-down transfer method discuss above, and in various embodiments, the top-epilayer-up transfer method may be used to transfer unprocessed, semi-processed, or fully-processed QCL or QCL-PIC epilayers or devices onto a high-thermal-conductivity foreign substrate. In the present example, and with reference first to FIG. 3A, a QCL (or QCL-PIC) wafer 300 includes the native substrate 104, as described above, as well as the etch stop layer 204 (having a lower etch rate than the native substrate 104), and a QCL (or QCL-PIC) structure 302. In various embodiments, the QCL (or QCL-PIC) structure 302 may include the QCL heterostructure 106, metal layers 114 (including a side contact for side injection), a current injection layer 304, and/or other features such as described above or other suitable features. Although schematically illustrated as including a single QCL (or QCL-PIC) structure 302, it will be understood that the QCL (or QCL-PIC) wafer 300 may include any of a plurality of unprocessed, semi-processed, or fully-processed QCL or QCL-PIC epilayers or devices.

Figure 3D:
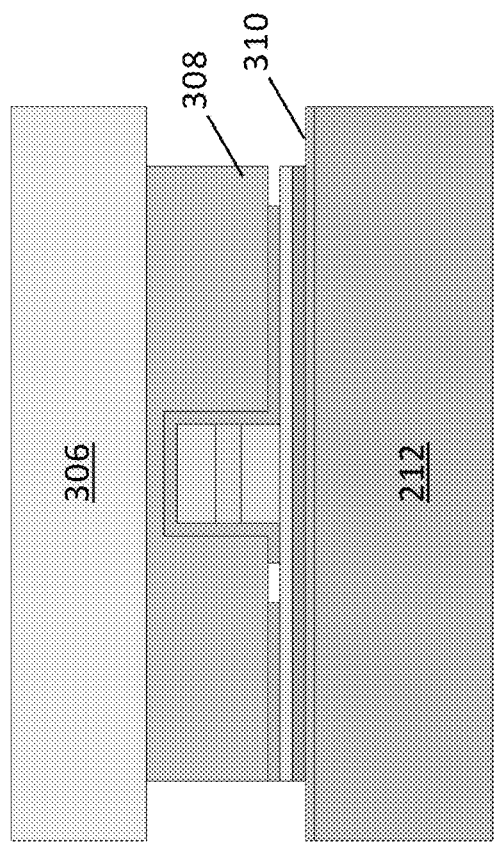
Figure 3C:
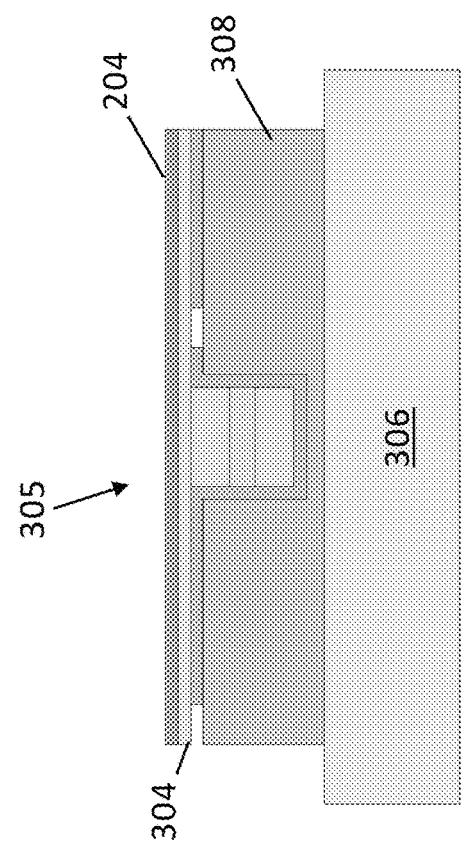

In the illustrated top-epilayer-up transfer method, the QCL (or QCL-PIC) wafer 300, the top epilayer of the QCL heterostructure 106 remains farthest away from the foreign substrate after the transfer process, as discussed below. Stated another way, the top-epilayer-up transfer is achieved by temporary epi-side-down (face-down) bonding of the QCL (or QCL-PIC) wafer 300 (or other wafer with unprocessed, semi-processed, or fully-processed QCL or QCL-PIC devices) to a carrier wafer 306 using a removable adhesive 308, as illustrated in the example of FIG. 3B. The carrier wafer 306 may alternatively be referred to as a wafer holder, in some cases. The carrier wafer 306, in some embodiments, may include silicon, quartz, glass, or other suitable material. In various embodiments, the removable adhesive may include a glue layer that may later be dissolved (e.g., in acetone) or some other appropriate removable material. Following the bonding of the QCL (or QCL-PIC) wafer 300 to the carrier wafer 306, the native substrate 104 is removed, as shown in FIG. 3C by using a selective etchant, as described above, to expose a back side 305 of the QCL (or QCL-PIC) structure 302. In some embodiments, the back side 305 exposes a surface of the etch stop layer 204, as shown. However, in some cases, the etch stop layer 204 may be removed along with removal of the native substrate 104, with the back side 305 instead exposing the current injection layer 304 or other layer of the QCL (or QCL-PIC) structure 302. Stated another way, the selective removal of the native substrate 104 using the selective etchant may or may not remove the etch stop layer 204. Further, regardless of whether the etch stop layer 204 is removed, the QCL (or QCL-PIC) structure 302 remains bonded (epi-side-down) to the carrier wafer 306 after removal of the native substrate 104.

Figure 3E:
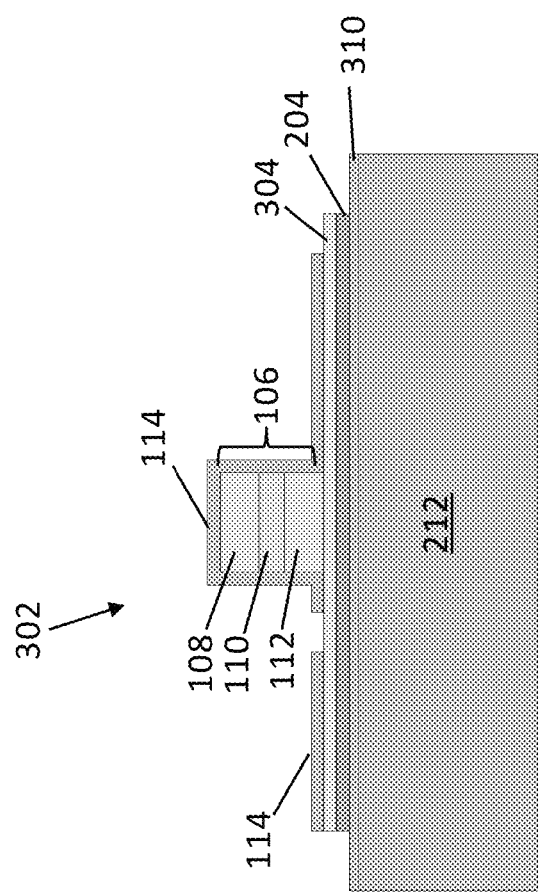

Following removal of the native substrate 104, and in some embodiments, the QCL (or QCL-PIC) structure 302 on the carrier wafer 306 is wafer-bonded to a high-thermal-conductivity substrate, such as the foreign substrate 212, along the back side 305 of the QCL (or QCL-PIC) structure 302. The wafer configuration after the wafer-bonding to the foreign substrate 212 is shown in FIG. 3D. In the present example, the wafer bonding of the QCL (or QCL-PIC) structure 302 on the carrier wafer 306 to the foreign substrate 212 may be performed using a thermo-compression metal-metal bonding process, as described above, where a bonding material 310 includes one or more layers of Au or a Au-containing material layer (e.g., such as Ti/Au or Ti/Pt/Au), like the bonding materials 208, 210, discussed above. In some examples, the bonding material 310 may alternatively include one or more layers of Cu or a Cu-containing material layer. In some embodiments, the thermo-compression metal-metal bonding process may be performed as a wafer-level (e.g., in contrast to die-level) epilayer-up bonding process since the bonding may be performed prior to cleaving or dicing of individual die, and with the top epilayer of the QCL heterostructure 106 remaining farthest away from the foreign substrate 212 after the transfer process. After the wafer-bonding to the foreign substrate 212 (FIG. 3D), the carrier wafer 306 is removed by removing the adhesive (e.g., using acetone or other solvent), resulting in the device configuration as shown in FIG. 3E. It is also noted that similar to the top-epilayer-down transfer method previously described, the bonding material 310 used in the top-epilayer-up transfer method is optional. For example, in some embodiments, a direct wafer bonding of the QCL (or QCL-PIC) structure 302 on the carrier wafer 306 to the foreign substrate 212, without using any metal bonding material, may also be possible as described above.

To confirm the practical importance of the disclosed methods, thermal simulations were performed for various configurations of InGaAs/AlInAs/InP QCL devices to estimate the improvement on thermal resistance by replacing the InP substrate with a SiC substrate. The devices 100, 125, 150, 175 discussed above and illustrated in FIGS. 1A-1D, respectively, show typical mounting configurations of state-of-the-art QCL devices on an InP substrate including an epi-up mounted ridge waveguide (Case 1, device 100 of FIG. 1A), an epi-up mounted buried-heterostructure (BH) waveguide (Case 2, device 150 of FIG. 1C), an epi-down mounted ridge waveguide (Case 3, device 125 of FIG. 1B), and an epi-down mounted BH waveguide (Case 4, device 175 of FIG. 1D). For purposes of comparison, FIGS. 4A-4D show four cases of the same device types as those shown in FIGS. 1A-1D, except the devices of FIGS. 4A-4D are transferred to the foreign substrate 212 (a SiC substrate, in this example). Specifically, the devices of FIGS. 4A-4D include an epi-up mounted ridge waveguide (Case 5, device 400 of FIG. 4A), an epi-up mounted buried-heterostructure (BH) waveguide (Case 6, device 450 of FIG. 4C), an epi-down mounted ridge waveguide (Case 7, device 425 of FIG. 4B), and an epi-down mounted BH waveguide (Case 8, device 475 of FIG. 4D). For avoidance of doubt, and as shown in the example of FIGS. 4A-4D, each of the devices 400, 425, 450, 475 may include one or more layers, materials, structures, or other features as described above with reference to the devices 100, 125, 150, 175, the top-epilayer-down transfer method (FIGS. 2A/2B), and/or the top-epilayer-up transfer method (FIGS. 3A-3E). Thus, for clarity of discussion, some aspects of the devices 400, 425, 450, 475 may only be briefly described. It is also noted that in various embodiments, each of the devices 400, 425, 450, 475 may include QCL epilayers transferred to the foreign substrate 212 using either the top-epilayer-down transfer method or the top-epilayer-up transfer method.

For purposes of thermal simulation, a ridge width of 8 μm, a BH width of 50 μm on each side, a dissipated heat of 18 kW/cm$^2$, and continuous-wave operation at a heat sink temperature of 293° K is assumed. These are generally typical dimensions and operational parameters for state-of-the-art QCLs. It is further assumed that copper is the heat sink material (e.g., the copper block 102) and that there is a 10-μm-thick indium layer for the bonding material to bond the QCLs to the heat sink (e.g., the bonding solder 116). For the devices bonded to the foreign high-thermal-conductivity substrate 212 (devices 400, 425, 450, 475), it is assumed that a 200-nm-thick gold layer is used as an adhesive layer (e.g., such as the bonding materials 208, 210, 310). These are generally typical practical conditions. The thermal simulation performed solves the 2-dimensional heat transfer equation to estimate the temperature of the active region (e.g., the active region 110) for the given dissipated power and material parameters. Then, an estimated thermal resistance is defined as a ratio of the maximum QCL active region temperature increase with respect to the heatsink temperature to the dissipated power.

Figure 5:
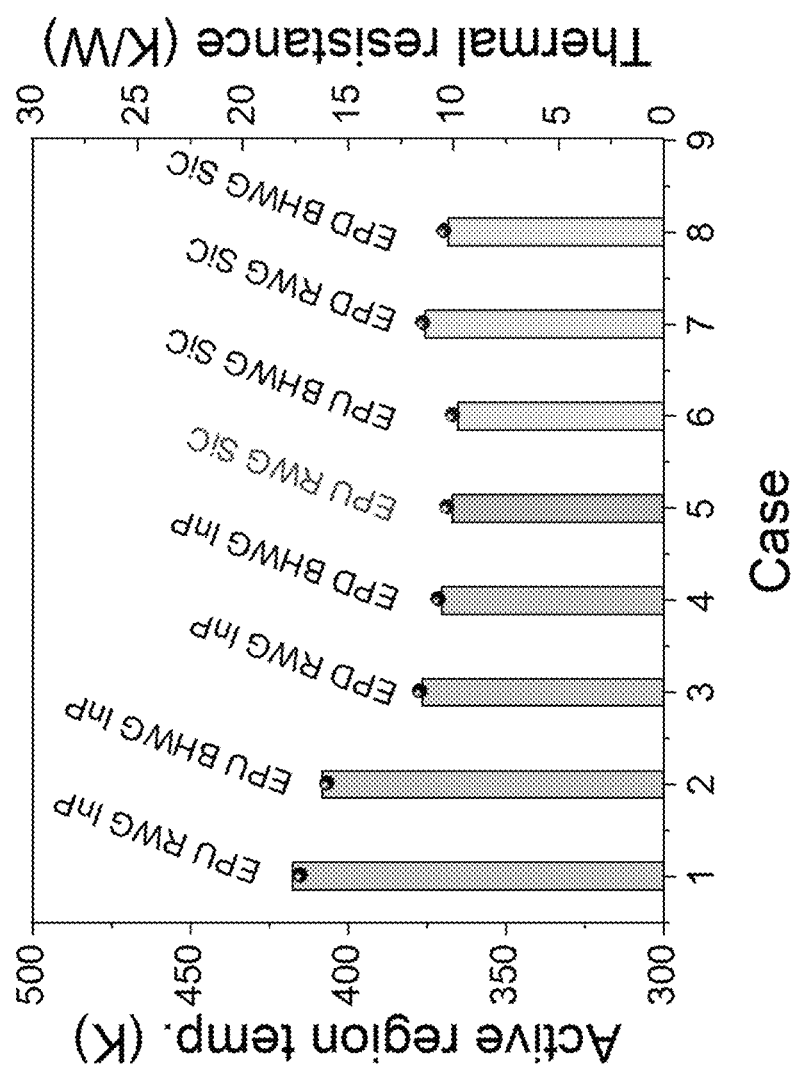
FIG. 5 illustrates results of thermal simulations corresponding to various QCL device configurations, in accordance with some embodiments.

FIG. 5 illustrates results of the thermal simulations, including active region temperature (bars) and thermal resistance (circles), corresponding to the eight configurations (Cases 1-8) shown in FIGS. 1A-1D (devices 100, 125, 150, 175) and FIGS. 4A-4D (devices 400, 425, 450, 475), as discussed above. The following abbreviations have been used in FIG. 5: EPU—Epi-up, RWG—ridge waveguide, and BHWG—buried-heterostructure waveguide. For the four devices 100, 125, 150, 175 on their native InP substrates (Cases 1-4), the thermal resistance values are estimated to be about 17.3 K/W, 16.0 K/W, 11.6 K/W, and 10.7 K/W, respectively. Changing the waveguide from the ridge type to the BH type results in about an 8% reduction of the thermal resistance (e.g., compare Case 1 to Case 2, or Case 3 to Case 4) while changing the device mounting from the epi-up mounting configuration to the epi-down mounting configuration results in about a 33% reduction of the thermal resistance (e.g., compare Case 1 to Case 3, or Case 2 to Case 4). These results indicate that the epi-down mounting configuration has the most significant impact to reduce the thermal resistance of the InP devices.

For the four devices 400, 425, 450, 475 on the foreign high-thermal-conductivity SiC substrates (Cases 5-8), results of the thermal simulation are substantially different. Specifically, for the Cases 5-8, the thermal resistance values are estimated to be about 10.3 K/W, 10.0 K/W, 11.5 K/W, and 10.5 K/W, respectively. It is noted that for each of the cases related to the devices 400, 425, 450, 475 transferred onto SiC (Cases 5-8) provide nearly the same thermal resistance values as the best case of the devices 100, 125, 150, 175 on their native InP substrates (Cases 1-4). Since SiC, like other high-thermal-conductivity substrates that may alternatively be used, works as a good heat sink and heat spreader, both the epi-up and epi-down mounted devices have similar thermal resistance regardless of their mounting configurations. These results indicate that the devices on the foreign SiC substrate can have a low thermal resistance even when mounted in the epi-up mounting configuration, which is a much simpler mounting process compared to the epi-down mounting configuration process. In addition, a slightly increased thermal resistance in Case 7 compared to Case 5 indicates the advantage of having both a high-thermal-conductivity substrate (such as SiC) and the epi-up mounting configuration.

Figure 6A:
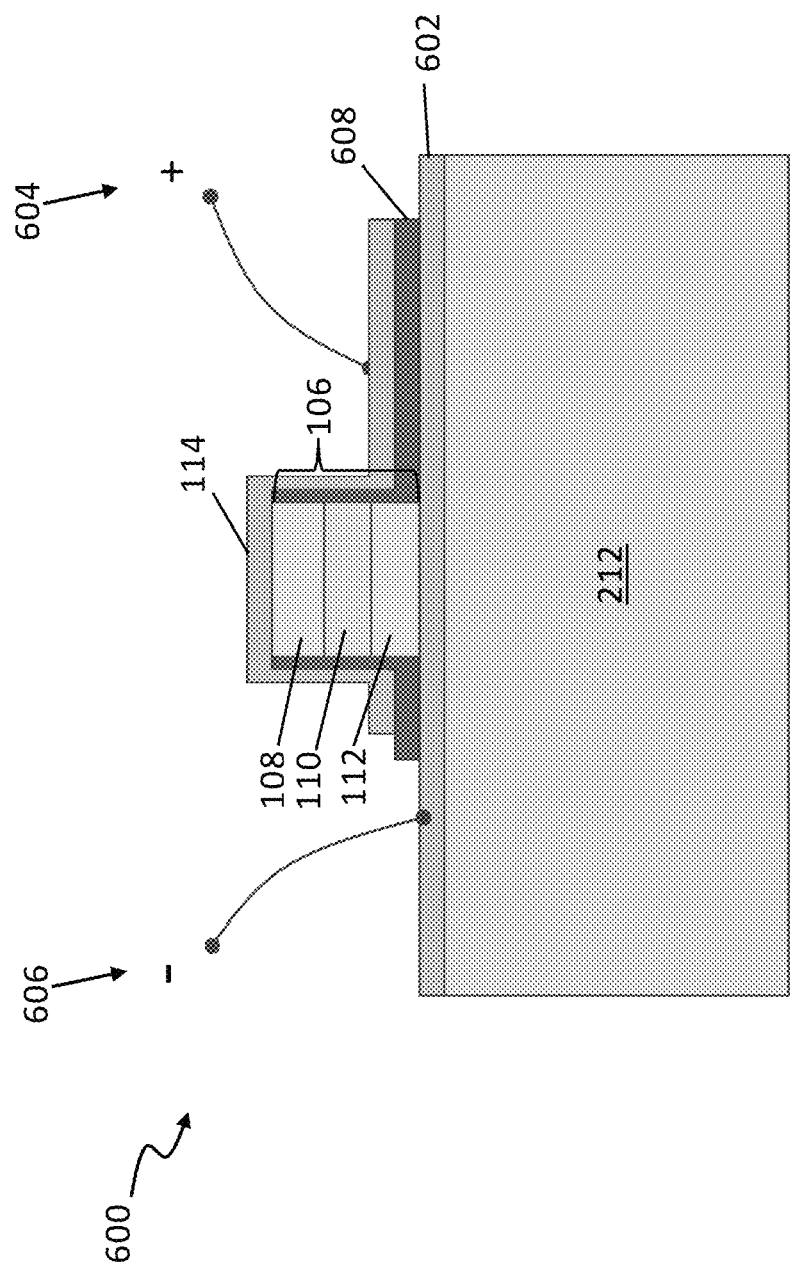
FIG. 6A illustrates a QCL device bonded to a foreign substrate, with an exemplary bias configuration shown, in accordance with some embodiments.

As a further verification of the improved thermal resistance of QCL devices on SiC, Fabry-Perot type QCL devices were fabricated both with the native InP substrate and with the SiC substrate (the foreign high-thermal-conductivity substrate). Fabrication of the QCL devices on the InP substrate is substantially the same as a conventional ridge waveguide QCL process where the ridges are defined by photolithography and wet etching, followed by ridge sidewall insulation and metallization for current injection. For the QCL devices on the SiC substrate, the first step is to deposit a Ti/Au metal layer on the surface of the QCL wafer (e.g., including QCL epilayers on a native InP substrate) and the SiC substrate. Then, both wafers are bonded using the Ti/Au metal layer as a bonding material as shown schematically in FIGS. 2A/2B. To accomplish the thermo-compression metal-metal bonding process, the wafers were loaded into a vacuum chamber of a thermo-compression wafer bonder, heated up to about 350° C., and compressed under several MPa of pressure for about 30-60 min. After the bonding process, the native InP substrate is removed by mechanical lapping and selective wet etching to expose the InGaAs etch-stop layer (e.g., such as the etch stop layer 204). Then, the QCL epilayers (now transferred to the SiC substrate) are further processed into ridge waveguide devices using substantially the same process as used for the QCL devices on the InP substrate. To further improve heat extraction, the ridge metal contacts of QCL devices on both the InP and SiC substrates were electroplated with Au to a final thickness of about 3 μm. In addition, to exclude the effect of voltage drop across the SiC substrate, QCL devices on both the InP and SiC substrates are fabricated to have a side injection configuration, as shown in QCL device 600 of FIG. 6A, where the current is extracted via the cladding layer on the ridge bottom.

Like one or more of the devices previously discussed, the device 600 includes the foreign substrate 212 (SiC substrate), the QCL heterostructure 106 (including the upper cladding layer 108, the active region 110, and the lower cladding layer 112), the metal layer 114, and a metal layer 602. The metal layer 114 may be used to form a top contact 604. The metal layer 602 may include the Ti/Au metal layer serving as the bonding material (e.g., similar to the bonding materials 208, 210, 310, discussed above), and in the present example, the metal layer 602 may also provide a side contact 606. The device 600 is further illustrated as including a dielectric layer 608 which serves to isolate the top contact 604 from the side contact 606. In the present example, the dielectric layer 608 includes silicon nitride (SiN). However, other dielectric materials may be used for the dielectric layer 608, without departing from the scope of this disclosure.

Figure 6C:
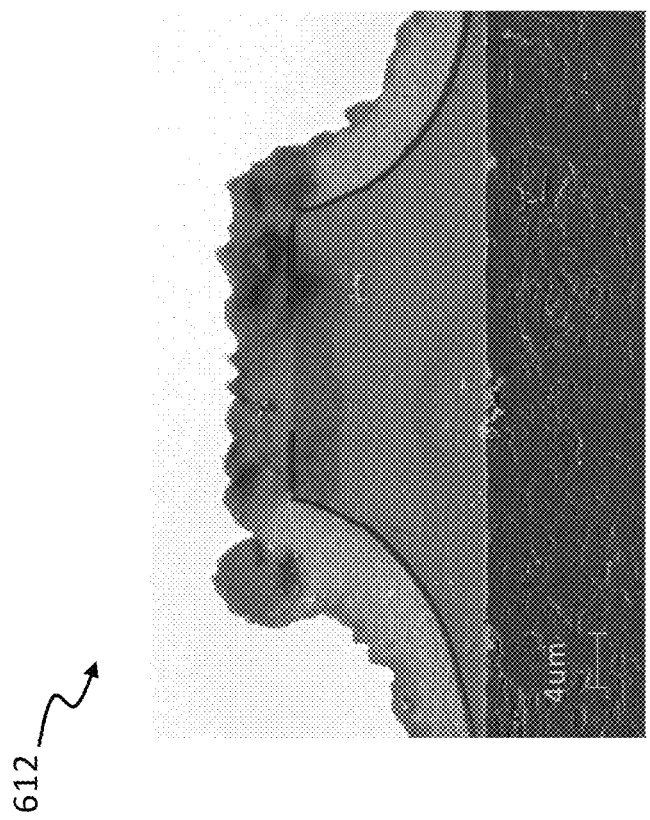
FIGS. 6B and 6C show cross-sectional scanning electron microscope (SEM) images of a QCL device on an InP substrate and on a SiC substrate, in accordance with some embodiments.
Figure 6B:
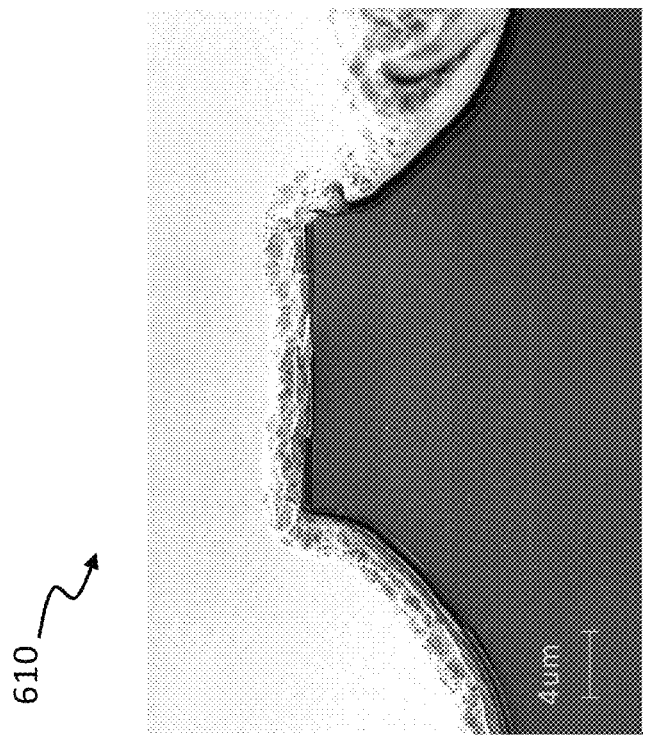

It is also noted that the biasing polarity of the QCL devices on the SiC substrate is opposite to that of the QCL devices on the InP substrate as the QCL epilayer was flipped during the wafer bonding process (e.g., as part of the top-epilayer-down transfer method). As shown, and during operation, the device 600 is negatively biased at the side contact 606, while current is injected through the top contact 604. The QCL devices on the InP substrate were cleaved to make laser facets while the QCL devices on the SiC substrate were diced using a dicing saw due to the hardness of SiC that makes it difficult to obtain mirror-like cleaved facets. For purposes of illustration, FIGS. 6B and 6C show cross-sectional scanning electron microscope (SEM) images of a QCL device 610 on an InP substrate and a QCL device 612 on a SiC substrate, respectively. Several devices of each type were fabricated and mounted on copper heat sinks (e.g., such as the copper block 102, discussed above) and wire-bonded for testing. The devices were characterized in pulsed mode, and all measurements were performed at room temperature.

Figure 7:
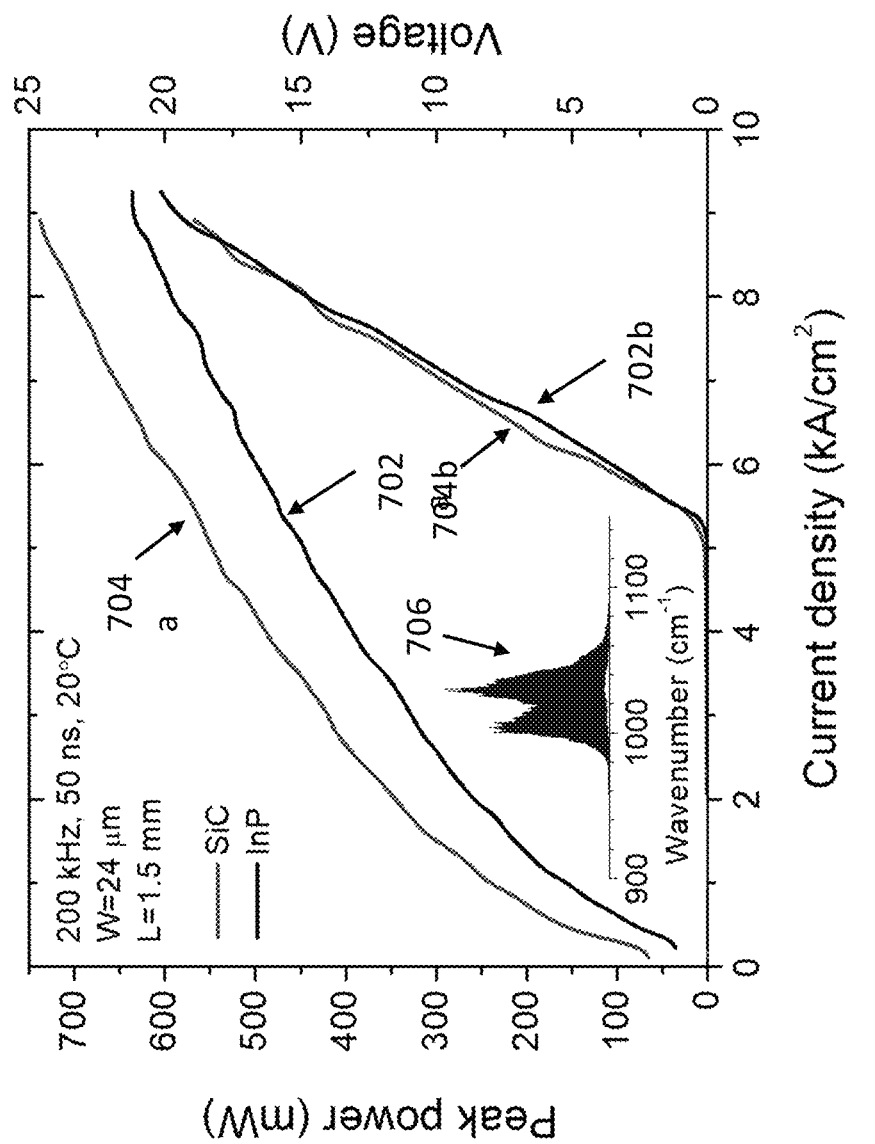
FIG. 7 illustrates light-current-voltage measurement results for QCL devices fabricated on InP and SiC substrates, in accordance with some embodiments.

Referring now to FIG. 7, illustrated therein are light-current-voltage measurement results for the QCL devices fabricated on native InP and SiC substrates. The device ridge width (24 μm), cavity length (1.5 mm), pulse biasing condition (50-ns current pulses at 200 kHz repetition frequency), and heat-sink temperature (20° C.) are indicated in the upper-left inset. In particular, FIG. 7 plots the light-current-voltage characteristics of the devices of each type (InP devices are indicated as curves 702a/702b, and SiC devices are indicated as 704a/704b) having the same dimensions of 1.5 mm cavity length and 24 μm ridge width. A typical laser emission spectrum 706 is shown in the lower-left inset. Both device types (InP and SiC) show a substantially identical threshold current density of 5 kA/cm², which indicates that the conditions of the diced facets of the QCL devices on SiC substrates did not cause a significant reduction in reflectivity at the laser operating wavelength of approximately 10 microns. In addition, the slope efficiency is measured to be about 470 mW/A for devices on both InP and SiC substrates. It is noted that for the QCL devices on SiC substrates, there may be some voltage increase as compared to the QCL devices on InP substrates, in at least some cases. In the present example, the QCL device on the SiC substrate showed a 3.5 V higher operating voltage compared to the QCL device on the InP substrate. A Schottky barrier at the wafer-bonding interface may be responsible for the observed voltage increase, which can be mitigated by employing an ohmic contact using either a layer of highly-doped semiconductor or employing Ni/Au/Ge alloyed metallization. We note that is also possible to bias the QCLs on the SiC substrate through the substrate itself if the substrate is chosen to be electrically conductive. Such electrically conductive SiC substrates are readily available.

Figure 8:
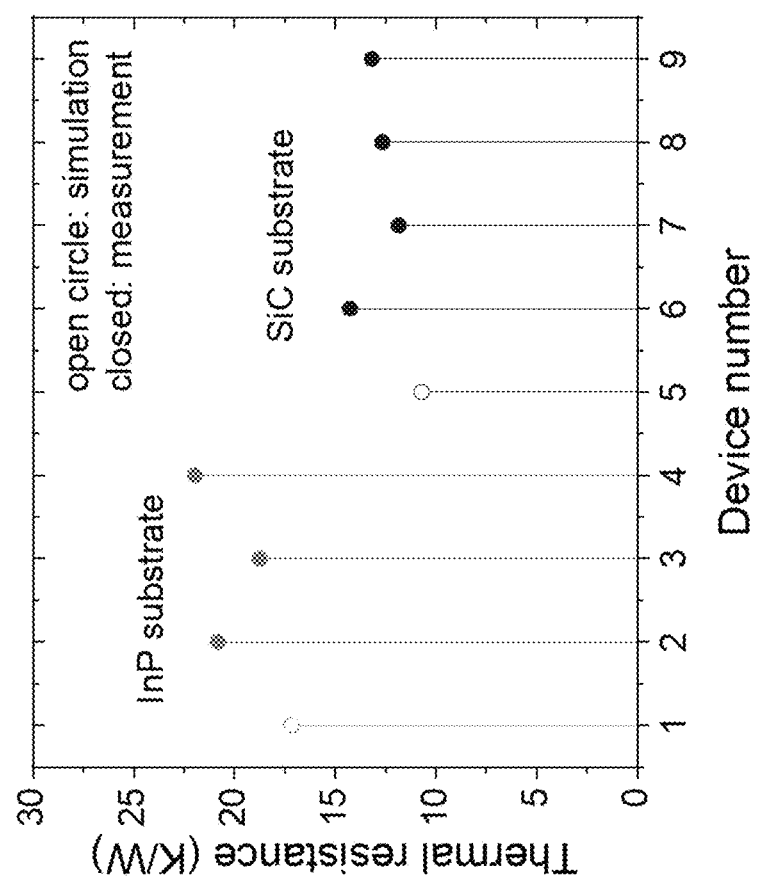
FIG. 8 illustrates thermal resistance results for QCL devices fabricated on InP and SiC substrates, in accordance with some embodiments.

With reference to FIG. 8, illustrated therein are thermal resistance results for the QCL devices fabricated on native InP and SiC substrates. The results shown in FIG. 8 illustrate both measured results (closed circles) and simulated results (open circles). In order to characterize thermal resistance, the dependence of the wavelength (λ) of Fabry-Perot laser modes on the laser heatsink temperature (T) and the Fabry-Perot laser modes wavelength dependence on the dissipated power (Pdiss) in the tested devices were measured. The thermal resistance of the QCL devices is then estimated using the following relation:

$$R_{th} = \frac{dT}{d\lambda}\frac{d\lambda}{dP_{diss}}(K/W)$$

The thermal resistance values obtained from testing of three QCLs on InP substrates and four QCLs on SiC substrates are summarized in FIG. 8. It is noted that all tested devices were attached to copper heat sinks in the epi-up mounting configuration using the same solder and following the same procedures, and thus the difference in their thermal resistance results solely from differences in their substrates (InP or SiC). As shown, the average thermal resistance of the QCL devices on InP substrates (device numbers 2, 3, 4) is 20.43 K/W and that of the QCL devices on SiC substrates (device numbers 6, 7, 8, 9) is 12.99 K/W, i.e., about 36% lower than the devices fabricated on the InP substrates. The marked improvement observed in the experimental results shows excellent agreement with the 38% improvement observed in the simulations shown in FIG. 5 for epi-up mounted devices. The simulated values of the thermal resistance of the specific devices tested experimentally are also shown in FIG. 8 (device number 1 for the InP substrate, and device number 5 for the SiC substrate). As shown, the experimentally measured thermal resistance values are about 15% higher than the simulated values, as also shown in FIG. 8.

With reference to FIG. 9, illustrated therein is a table 900 illustrating various combinations (exemplary embodiments 1-6) of substrate type, epi-layer condition, and bias scheme for QCL devices that may be fabricated in accordance with various embodiments. The substrate type refers to the high thermal conductivity foreign substrate, such as the foreign substrate 212 (discussed above), onto which the QCL or QCL-PIC epilayers or devices are transferred. In the exemplary embodiments 1-3, the substrate is thermally conductive (as indicated by tick marks 'IT') but not electrically conductive, while in the exemplary embodiments 4-6, the substrate is both thermally conductive and electrically conductive. The epi-layer condition refers to whether the QCL epilayers on their native substrate are processed, semi-processed, or unprocessed. In the case of unprocessed or semi-processed epilayers, additional processing may be performed after transfer of the QCL epilayers to the foreign substrate in order to complete fabrication of the QCL or QCL-PIC device. In the exemplary embodiments 1 and 4, the epilayers are unprocessed (or non-processed), in the exemplary embodiments 2 and 5, the epilayers are partially processed, and in the exemplary embodiments 3 and 6, the epilayers are fully processed. Thus, in the exemplary embodiments 3 and 6, additional processing of the QCL epilayers may not be needed after transfer of the QCL epilayers to the foreign substrate. The bias scheme refers to whether the fabricated QCL or QCL-PIC devices operate using side injection (e.g., via a side contact) and/or top-bottom injection (e.g., via top and bottom contacts). In the exemplary embodiments 1-3, since the substrate is thermally conductive but not electrically conductive, the bias scheme will be side injection. For the exemplary embodiments 4-6, since the substrate is both thermally conductive and electrically conductive, the bias scheme may be side injection and/or top-bottom injection.

Elaborating on the QCL bias schemes (e.g., as shown in FIG. 9), reference is now made to FIGS. 10, 11A, and 11B, which illustrate QCL devices 910, 920, 930, respectively. As shown, each of the devices 910, 920, 930 includes the foreign substrate 212 (e.g., such as SiC, diamond, AlN, BeO, or other high-thermal-conductivity substrate), the QCL heterostructure 106 (including the upper cladding layer 108, the active region 110, and the lower cladding layer 112), the metal layer 114 (e.g., to form two or more of the top contact, the bottom contact, and the side contact), a bonding material layer (e.g., such as the bonding materials 208, 210, 310), and the dielectric layer 608 (e.g., such as SiN). By way of example, the device 910 illustrates a top-bottom injection configuration, where current flow is defined as being between the top contact (disposed over the QCL ridge) and the bottom contact (disposed on the backside of the foreign substrate 212). Of course, for the top-bottom injection configuration, the selected foreign substrate 212 should be electrically conductive (in addition to being thermally conductive). Both of the devices 920 and 930 illustrate a side injection configuration, where current flow is defined as being between the top contact (disposed over the QCL ridge) and the side contact (disposed adjacent to the QCL ridge). In the side injection configuration, the selected foreign substrate 212 need not be, but may be, electrically conductive (in addition to being thermally conductive). The different between the devices 920, 930 is that in the device 930 the lower cladding layer 112 is not fully etched during formation of the ridge, resulting in a remaining lower cladding layer portion 112A on opposing adjacent sides of the ridge. Thus, for the device 930, current flow may proceed though both the bonding material layer (e.g., Ti/Au) and at least partially through the remaining lower cladding layer portion 112A. The remaining lower cladding layer portion 112A may include a low-doped semiconductor layer, thus the device 930 is expected to have a higher resistance than the device 920 where the lower cladding layer 112 is fully etched during formation of the ridge. While the configuration of the device 920 is thus preferable for its lower resistance, it may be challenging to stop the ridge etching process precisely at the interface between the lower cladding layer 112 and the bonding material layer (e.g., at least because of the etch accuracy and the bonding layer thickness). On the other hand, the configuration of the device 930 allows for relaxed etch tolerance and better mechanical stability since the thinner bonding material layer is more susceptible to damage during compression bonding. While the top-bottom injection configuration and the side injection configuration were described as being applied to different devices 910, 920, 930, it will be understood that in some embodiments, a given QCL device may be configured to have both top-bottom injection and side injection, as discussed below.

As previously discussed, embodiments of the present disclosure provide for wafer bonding of processed, semi-processed, or unprocessed QCL and QCL-PIC epilayers or devices on their native substrates to high-thermal-conductivity substrates (e.g., such as the foreign substrate 212) followed by removal of their native substrate via selective etching, performing additional device processing if necessary (e.g., in the case of unprocessed wafers or semi-processed devices), and cleaving or dicing individual devices from the bonded wafers for mounting onto heat sinks. To provide further discussion, reference is made to FIGS. 12A/12B and FIGS. 13A/13B, which illustrate some exemplary methods of fabricating a QCL device that include wafer bonding of unprocessed epilayers (FIGS. 12A/12B) and wafer bonding of semi-processed or fully processed epilayers or devices (FIGS. 13A/13B).

Referring first to FIG. 12A, a device 940 includes the foreign substrate 212 (e.g., such as SiC, diamond, AlN, BeO, or other high-thermal-conductivity substrate), unpatterned QCL epilayers (including the upper cladding layer 108, the active region 110, and the lower cladding layer 112), and a bonding material layer (e.g., such as the bonding materials 208, 210, 310) used to bond the foreign substrate 212 to the unpatterned QCL epilayers (e.g., by metal-metal thermo-compression bonding, as discussed above). After bonding the foreign substrate 212 to the unpatterned QCL epilayers, and with reference to FIG. 12B, additional device processing is performed to complete fabrication of the device 940. In some embodiments, the additional device processing may include defining the QCL ridges (e.g., by photolithography and wet etching), followed by ridge sidewall insulation (e.g., formation of the dielectric layer 608), and metallization (e.g., formation of the metal layer 114 to form two or more of the top contact, the bottom contact, and the side contact) for current injection. In the present example, the device 940 is shown to include a top contact, bottom contact, and a side contact. Thus, in various examples, the device 940 is configured for both top-bottom injection and side injection.

Referring now to FIG. 13A, a device 950 includes the foreign substrate 212 (e.g., such as SiC, diamond, AlN, BeO, or other high-thermal-conductivity substrate), the patterned QCL heterostructure 106 (including the upper cladding layer 108, the active region 110, and the lower cladding layer 112), and a bonding material layer (e.g., such as the bonding materials 208, 210, 310) used to bond the foreign substrate 212 to the partially processed QCL device including the patterned QCL epilayers. After bonding the foreign substrate 212 to the patterned QCL epilayers, and with reference to FIG. 13B, additional device processing is performed to complete fabrication of the device 950. In some embodiments, the additional device processing may include ridge sidewall insulation (e.g., formation of the dielectric layer 608) and metallization (e.g., formation of the metal layer 114 to form two or more of the top contact, the bottom contact, and the side contact) for current injection. In the present example, the device 950 is shown to include a top contact, bottom contact, and a side contact. Thus, in various examples, the device 950 is configured for both top-bottom injection and side injection. Additionally, in some embodiments, the foreign substrate 212 may be bonded to a fully processed QCL device (e.g., including ridge sidewall insulation and metallization) such that additional processing is not needed after the bonding. It is further noted that the methods of bonding the foreign substrate to unprocessed QCL epilayers (FIGS. 12A/12B) and bonding the foreign substrate to semi-processed or fully processed QCL epilayers or devices (FIGS. 13A/13B) may, in various embodiments, be performed in combination with the top-epilayer-down transfer method (FIGS. 2A/2B), the top-epilayer-up transfer method (FIGS. 3A-3E), or any of the various combinations of substrate type, epi-layer condition, and bias schemes illustrated in FIG. 9.

Figure 14:
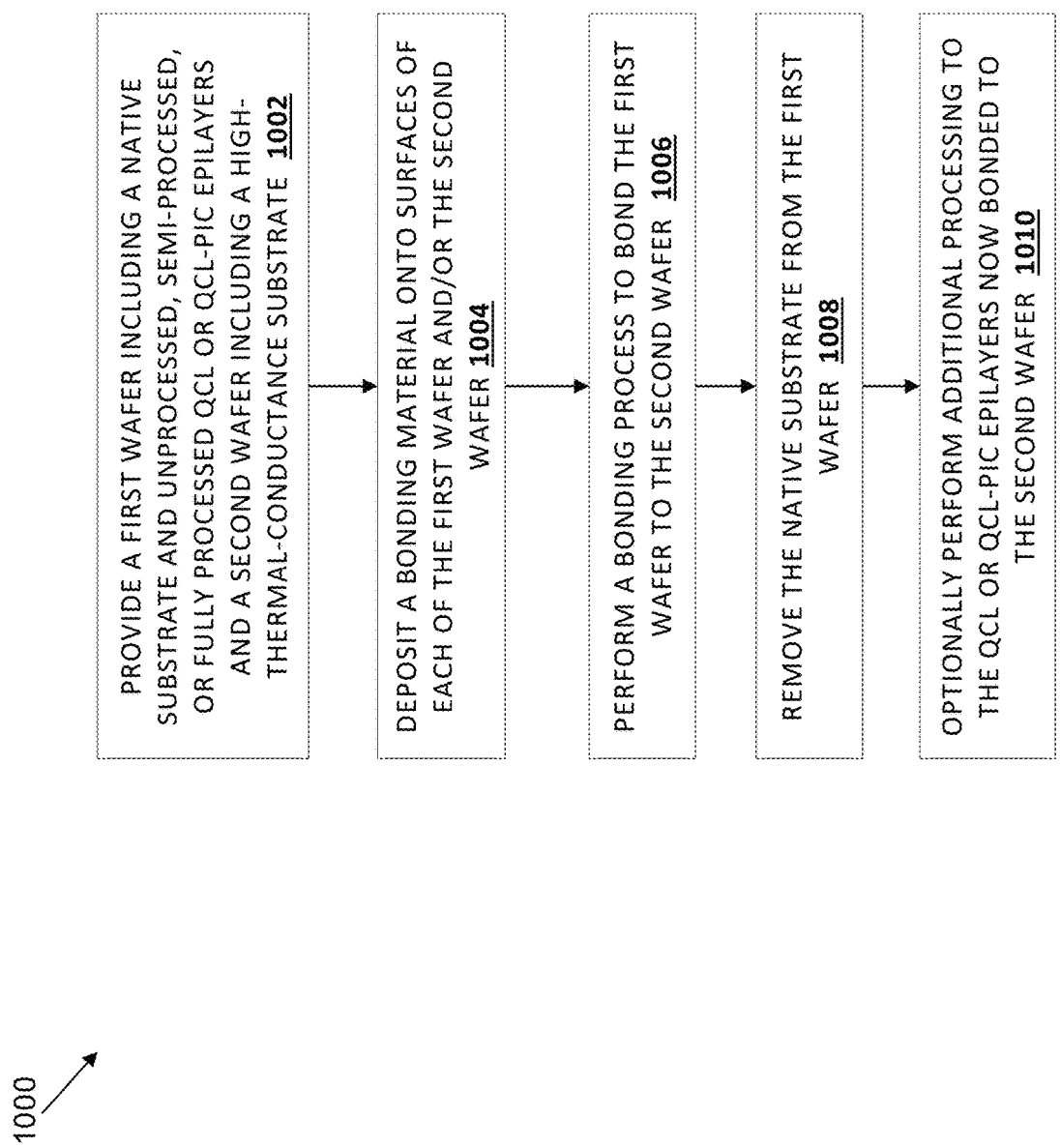
FIG. 14 is a flow chart of a method of fabricating a QCL and/or QCL-PIC device, according to one or more aspects of the present disclosure.

Referring to FIG. 14, illustrated therein is a method 1000 of QCL and/or QCL-PIC device fabrication, in accordance with various embodiments. The method 1000 may generally correspond to the top-epilayer-down transfer method, discussed above with reference to FIGS. 2A/2B. However, it will be understood that aspects of the method 1000 may be equally applied to fabrication of other types of QCL and/or QCL-PIC devices, without departing from the scope of the present disclosure. Thus, one or more aspects of the various QCL and/or QCL-PIC devices discussed above may also apply to the method 1000. Also, it will be understood that additional steps may be performed before, after, and/or during the method 1000, without departing from the scope of this disclosure.

The method 1000 begins at block 1002 where a first wafer and a second wafer are provided. The first wafer may include a native substrate (e.g., such as the native substrate 104) having unprocessed, semi-processed, or fully-processed QCL or QCL-PIC epilayers or devices formed thereon (e.g., such as the QCL or QCL-PIC epilayers 206). In some examples, an etch stop layer (e.g., such as the etch stop layer 204) is formed between the native substrate and the QCL or QCL-PIC epilayers. The second wafer may include a high-thermal-conductivity foreign substrate (e.g., such as the foreign substrate 212).

The method 1000 proceeds to block 1004 where a bonding material is deposited onto surfaces of each of the first wafer and the second wafer. For example, as shown in FIG. 2A, the bonding material 208 is deposited on the first wafer and the bonding material 210 is deposited on the second wafer. In some embodiments, the bonding material may include Au, Cu, Ti/Au, or other suitable conductive material. The method 1000 then proceeds to block 1006 where a bonding process is performed to bond the first wafer to the second wafer. For example, as shown in FIG. 2B, the first wafer may be bonded to the second wafer using a thermo-compression metal-metal bonding process, as described above. The method 1000 then proceeds to block 1008 where the native substrate is removed from the first wafer. For instance, after the bonding process of block 1006 and still referring to FIG. 2B, the native substrate (e.g., such as an InP substrate) is removed by mechanical lapping and selective wet etching to expose an etch-stop layer (e.g., such as the etch stop layer 204). In some embodiments, the etch-stop layer may also be removed along with the native substrate. Thereafter, the method 1000 proceeds to block 1010 where additional processing to the QCL or QCL-PIC epilayers (now bonded to the second wafer) is optionally performed (e.g., for the case of unprocessed or semi-processed QCL or QCL-PIC epilayers or devices). For example, in some embodiments, the QCL epilayers may be further processed into ridge waveguide devices (e.g., using photolithography and wet etching), followed by ridge sidewall insulation, and metallization for current injection, among other possible processes, to complete fabrication of the QCL or QCL-PIC devices on the second wafer. Thereafter, in some examples, individual QCL or QCL-PIC devices bonded to the second wafer are cleaved or diced for mounting onto heat sinks (e.g., such as the copper block 102).

With reference to FIG. 15, illustrated therein is a method 1050 of QCL and/or QCL-PIC device fabrication, in accordance with various embodiments. The method 1050 may generally correspond to the top-epilayer-up transfer method, discussed above with reference to FIGS. 3A-3E. However, it will be understood that aspects of the method 1050 may be equally applied to fabrication of other types of QCL and/or QCL-PIC devices, without departing from the scope of the present disclosure. Thus, one or more aspects of the various QCL and/or QCL-PIC devices discussed above may also apply to the method 1050. Also, it will be understood that additional steps may be performed before, after, and/or during the method 1050, without departing from the scope of this disclosure.

The method 1050 begins at block 1052 where a first wafer and a carrier wafer are provided. The first wafer may include a native substrate (e.g., such as the native substrate 104) having unprocessed, semi-processed, or fully-processed QCL or QCL-PIC epilayers or devices formed thereon (e.g., such as the QCL or QCL-PIC structure 302). In some examples, an etch stop layer (e.g., such as the etch stop layer 204) is formed between the native substrate and the QCL or QCL-PIC epilayers. The carrier wafer (e.g., such as the carrier wafer 306), in some embodiments, may include silicon, quartz, glass, or other suitable material.

The method 1050 proceeds to block 1054 where the first wafer is bonded epi-side down to the carrier wafer using a removable adhesive layer. For example, as shown in FIG. 3B, the wafer 300 including the QCL or QCL-PIC structure 302 is bonded epi-side down to the carrier wafer 306 using the removable adhesive layer 308. After bonding the first wafer to the carrier wafer, the method 1050 proceeds to block 1056 where the native substrate is removed from the first wafer. For instance, referring to FIG. 3C, the native substrate (e.g., such as an InP substrate) is removed by mechanical lapping and selective wet etching to expose a back side (e.g., the back side 305) of the QCL or QCL-PIC structure 302, where the exposed back side may include an etch-stop layer (e.g., such as the etch stop layer 204). In some embodiments, the etch-stop layer may also be removed along with the native substrate. After removal of the native substrate, the QCL or QCL-PIC epilayers or devices (e.g., such as the QCL or QCL-PIC structure 302) remain bonded (epi-side-down) to the carrier wafer 306.

The method 1050 then proceeds to block 1058 where a bonding material is deposited, and a bonding process is performed to bond the carrier wafer (including the QCL or QCL-PIC epilayers) to a second wafer. The second wafer may include a high-thermal-conductivity foreign substrate (e.g., such as the foreign substrate 212). For example, as shown in FIG. 3D, a bonding material (e.g., such as the bonding material 310) may be deposited on one or both of the back side 305 of the QCL or QCL-PIC structure 302 and the second wafer (the foreign substrate 212), and a bonding process is performed to bond the carrier wafer (along the back side 305) to the second wafer. As noted above, the carrier wafer may be bonded to the second wafer using a thermo-compression metal-metal bonding process. In addition, in some examples, the bonding material may include Au, Cu, Ti/Au, or other suitable conductive material.

After bonding the carrier wafer (including the QCL epilayers) to the second wafer (the foreign substrate 212), the method 1050 proceeds to block 1060 where the carrier wafer is removed by removing the adhesive layer. For example, FIG. 3E illustrates the resulting device configuration after removal of the carrier wafer 306. In various embodiments, the removable adhesive layer 308 may be removed using acetone or other appropriate solvent, thereby also removing the carrier wafer 306. Thereafter, the method 1050 proceeds to block 1062 where additional processing to the QCL or QCL-PIC epilayers or devices (now bonded to the second wafer) is optionally performed (e.g., for the case of unprocessed or semi-processed QCL or QCL-PIC epilayers or devices). For example, in some embodiments, the QCL epilayers may be further processed into ridge waveguide devices (e.g., using photolithography and wet etching), followed by ridge sidewall insulation, and metallization for current injection, among other possible processes, to complete fabrication of the QCL or QCL-PIC devices on the second wafer. Thereafter, in some examples, individual QCL or QCL-PIC devices bonded to the second wafer are cleaved or diced for mounting onto heat sinks (e.g., such as the copper block 102).

Figure 16B:
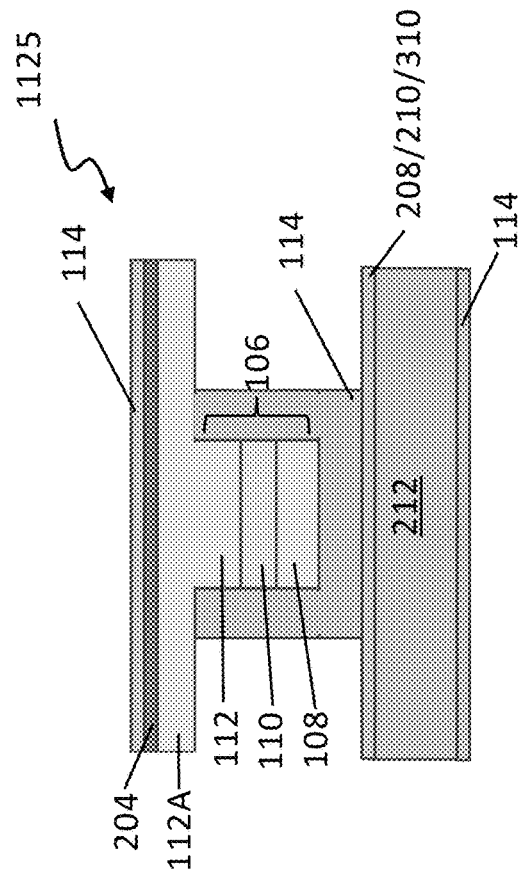
FIGS. 16A, 16B, 16C, and 16D illustrate a schematic view of a top-epilayer-down transfer method of processed or semi-processed QCL and QCL-PIC devices, in accordance with some embodiments.
Figure 16A:
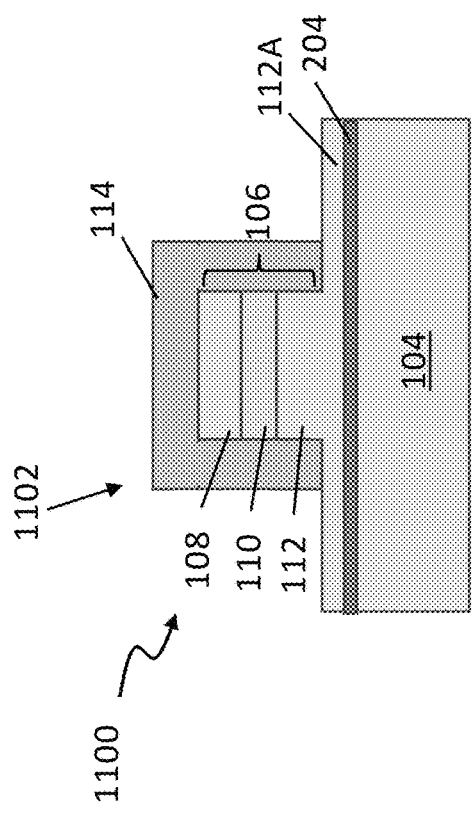

With reference to FIGS. 16A-16D, illustrated therein is a schematic view of the top-epilayer-down transfer method described in FIG. 14 for the case of transferring fully-processed or semi-processed QCL and QCL-PIC devices onto a high-thermal-conductivity foreign substrate. The example of FIGS. 16A-16D are given in addition to the examples shown in FIGS. 2A/2B that schematically illustrate the top-epilayer-down transfer method for the case of unprocessed QCL and QCL-PIC wafers. Referring first to FIG. 16A, a QCL (or QCL-PIC) wafer 1100 includes a QCL (or QCL-PIC) structure 1102 having the native substrate 104, the etch stop layer 204, the lower cladding layer 112, the QCL active region 110, the upper cladding layer 108, and the metal contact layer 114, each of which has been previously described. The lower cladding layer portion 112A, described above and which may remain after formation of the ridge, is also illustrated. However, it will be understood that in other embodiments, the lower cladding layer 112 may be fully etched during ridge formation such that there is substantially no remaining unetched lower cladding layer portion 112A. In some cases, the QCL heterostructure 106 may optionally be formed over a passive waveguide heterostructure that interposes the QCL heterostructure 106 and the etch-stop layer 204 to fabricate QCL-PIC devices. In some cases, the passive waveguide heterostructure may be formed on top of the QCL cladding layer 108 to fabricate QCL-PIC devices. As described above, the passive waveguide heterostructure may include any of a plurality of material systems configured to guide light along a particular direction, for example, by utilizing a waveguide core layer surrounded by cladding layers having a lower index of refraction than the waveguide core layer. Although schematically illustrated in FIG. 16A as including a single QCL (or QCL-PIC) structure 1102, it will be understood that the QCL (or QCL-PIC) wafer 1100 may include any of a plurality of semi-processed or fully-processed QCL or QCL-PIC epilayers or devices.

In the illustrated top-epilayer-down transfer method of semi-processed or fully-processed QCL (or QCL-PIC) wafer 1100, the top epilayer of the QCL heterostructure 106 remains closest to the foreign substrate after the transfer process, as discussed below. Stated another way, the top-epilayer-down transfer is achieved by epi-side-down (face-down) bonding of the semi-processed or fully-processed QCL (or QCL-PIC) wafer 1100 to a high-thermal-conductivity substrate, such as the foreign substrate 212, as illustrated in the example of FIG. 16B. In some embodiments, the bonding of the semi-processed or fully-processed QCL (or QCL-PIC) wafer 1100 to the foreign substrate 212 is performed using a thermo-compression metal-metal bonding process, as described above. Following the bonding of the QCL (or QCL-PIC) wafer 1100 to the high-thermal-conductivity substrate, such as the foreign substrate 212, the native substrate 104 is removed, as shown in FIG. 16B by using a selective etchant, as described above, to expose the etch-stop layer 204 of the QCL (or QCL-PIC) structure 1102. In some embodiments, the etch stop layer 204 remains in the device structure, as shown. However, in some cases, the etch stop layer 204 may be selectively removed along with removal of the native substrate 104, instead exposing the lower cladding layer portion 112A or other layer of the QCL (or QCL-PIC) structure 1102. Stated another way, the selective removal of the native substrate 104 using the selective etchant may or may not remove the etch stop layer 204. Further, regardless of whether the etch stop layer 204 is removed, the QCL (or QCL-PIC) structure 1102 remains bonded (epi-side-down) to the high-thermal-conductivity substrate, such as the foreign substrate 212, after removal of the native substrate 104. After the removal of the native substrate 104, additional processing of the device structure 1102, now bonded to high-thermal-conductivity foreign substrate 212, may be performed if necessary.

Figure 16D:
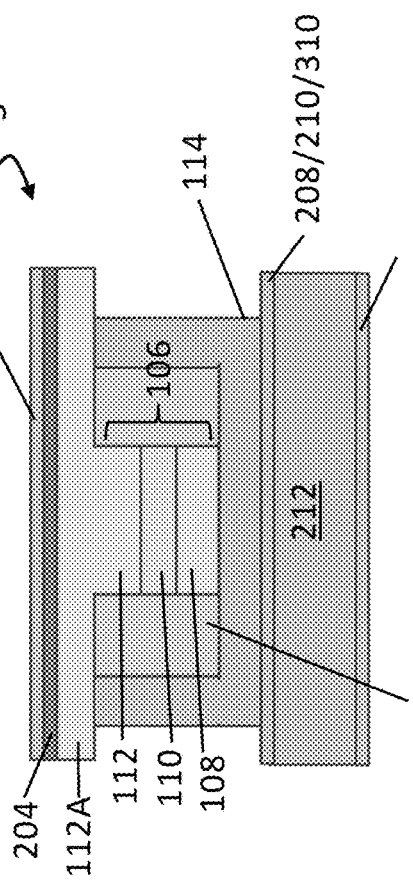
Figure 16C:
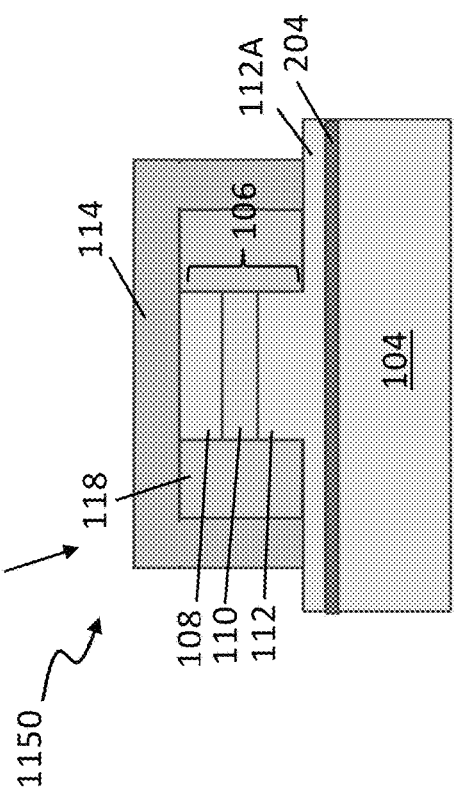

In the example shown in FIG. 16C, a QCL (or QCL-PIC) wafer 1150 includes a BH QCL (or BH QCL-PIC) structure 1152 having the native substrate 104, the etch stop layer 204, the lower cladding layer 112, the QCL active region 110, the upper cladding layer 108, and the metal contact layer 114, each of which has been previously described. The BH QCL configuration has also been previously described. The lower cladding layer portion 112A is once again illustrated. However, it will be understood that in other embodiments, the lower cladding layer 112 may be fully etched during ridge formation such that there is substantially no remaining unetched lower cladding layer portion 112A. As previously noted, the QCL heterostructure 106 may optionally be formed over a passive waveguide heterostructure or the passive waveguide heterostructure may be formed on top of the QCL cladding layer 108 to fabricate QCL-PIC devices. Although schematically illustrated in FIG. 16C as including a single BH QCL (or BH QCL-PIC) structure 1152, it will be understood that the BH QCL (or BH QCL-PIC) wafer 1150 may include any of a plurality of semi-processed or fully-processed BH QCL or BH QCL-PIC epilayers or devices.

In the illustrated top-epilayer-down transfer method of semi-processed or fully-processed BH QCL (or BH QCL-PIC) wafer 1150, the top epilayer of the QCL heterostructure 106 remains closest to the foreign substrate after the transfer process, as discussed below. Stated another way, the top-epilayer-down transfer is achieved by epi-side-down (face-down) bonding of the semi-processed or fully-processed BH QCL (or BH QCL-PIC) wafer 1150 to a high-thermal-conductivity substrate, such as the foreign substrate 212, as illustrated in the example of FIG. 16D. In some embodiments, the bonding of the semi-processed or fully-processed BH QCL (or BH QCL-PIC) wafer 1150 to the foreign substrate 212 is performed using a thermo-compression metal-metal bonding process, as described above. Following the bonding of the BH QCL (or BH QCL-PIC) wafer 1150 to the high-thermal-conductivity substrate, such as the foreign substrate 212, the native substrate 104 is removed, as shown in FIG. 16D by using a selective etchant, as described above, to expose the etch-stop layer 204 of the BH QCL (or BH QCL-PIC) structure 1152. In some embodiments, the etch stop layer 204 remains in the device structure, as shown. However, in some cases, the etch stop layer 204 may be selectively removed along with removal of the native substrate 104, instead exposing the lower cladding layer portion 112A or other layer of the BH QCL (or BH QCL-PIC) structure 1152. Stated another way, the selective removal of the native substrate 104 using the selective etchant may or may not remove the etch stop layer 204.

Further, regardless of whether the etch stop layer 204 is removed, the BH QCL (or BH QCL-PIC) structure 1152 remains bonded (epi-side-down) to the high-thermal-conductivity substrate, such as the foreign substrate 212, after removal of the native substrate 104. After the removal of the native substrate 104, additional processing of the device structure 1152, now bonded to high-thermal-conductivity foreign substrate 212, may be performed if necessary.

With respect to the description provided herein, the present disclosure provides structures and methods for reducing the thermal resistance of QCL and QCL-PIC devices, for example, by improving the vertical heat extraction of such devices. In various embodiments, the native substrate of QCL and QCL-PIC devices is replaced with a foreign substrate that has very high thermal conductivity (e.g., such as SiC, diamond, AlN, BeO, or other high-thermal-conductivity substrate). This is achieved using wafer bonding methods (e.g., such as a thermo-compression metal-metal bonding process). In some examples, wafer bonding of processed, semi-processed, or unprocessed QCL and QCL-PIC epilayers or devices on their native substrate to a high-thermal-conductivity substrate (the foreign substrate) is performed, followed by removal of the native substrate via selective etching, and performing additional device processing if necessary (e.g., in the case of unprocessed wafers or semi-processed devices). Thereafter, in some embodiments, cleaving or dicing individual devices from the bonded wafers may be performed, for example, for mounting onto heat sinks. In various examples, the transfer of the QCL or QCL-PIC epilayers onto the high-thermal-conductivity foreign substrates may be performed so that, at the end of the transfer, the top epilayer faces the foreign substrate (top-epilayer-down transfer) or in a way that the top epilayer remains on top when transferred onto the foreign substrate (top-epilayer-up transfer). Thermal simulation results have shown that an epi-up mounted QCL device bonded onto a high-thermal-conductivity substrate (e.g., SiC) can exhibit thermal resistance similar to or better than that of an epi-down-mounted QCL device on its native InP substrate. Thus, since epi-up mounted QCL devices bonded onto high-thermal-conductivity substrates offer performance that is equivalent to, or better than, epi-down mounted devices, the more complicated, low-throughput, and low-yield epi-down mounting process may be avoided. While some exemplary embodiments and advantages have been discussed above, these examples are not intended to be limiting beyond what is specifically recited in the claims that follow. Further, it will be understood that other embodiments and advantages will be evident to those skilled in the art upon reading the present disclosure.

For instance, those of skill in the art will readily appreciate that the methods and structures described herein may be applied to a variety of other semiconductor devices, semiconductor optical devices, semiconductor PICs, semiconductor PICs including QCL active regions, semiconductor laser devices, semiconductor laser devices including QCL active regions, semiconductor QCLs, or other semiconductor devices to advantageously achieve similar benefits from such other devices without departing from the scope of the present disclosure. Further, in some examples, the devices disclosed herein may be integrated with and/or include various other devices and features, such as transistors, resistors, capacitors, inductors, diodes, fuses, memory and/or other logic circuits, etc. In some embodiments, the devices disclosed herein may include a plurality of interconnected QCLs and/or QCL-PICS. Thus, in some cases, various aspects of the disclosed embodiments may be used to perform wafer-scale processing of devices. In some examples, the QCL and/or QCL-PIC devices described herein may further be integrated on a substrate including other types of optoelectronic devices such as resonator sensors, detectors, modulators, couplers, isolators, photodiodes, or other appropriate device. In some cases, the QCL and/or QCLPIC devices may be formed over and coupled (e.g., by way of one or more vias) to underlying CMOS circuits and/or devices, for example, as part of a 3D hybrid integrated photonics/CMOS device.

Thus, one of the embodiments of the present disclosure described a method of fabricating a semiconductor device including providing a first wafer, the first wafer including a native substrate and a plurality of epitaxial layers (epilayers) disposed over the native substrate. In some embodiments, the method further includes bonding the first wafer to a second wafer, the second wafer including a foreign substrate, where the bonding includes bonding a top epilayer of the plurality of epilayers to a top surface of the foreign substrate. After bonding the first wafer to the second wafer, and in some embodiments, the method further includes removing the native substrate from the first wafer, while the plurality of epilayers remain bonded to the foreign substrate.

In another of the embodiments, discussed is a method including providing a first substrate, the first substrate including an at least partially processed quantum cascade laser (QCL) device formed on an epitaxial side of the first substrate. In some embodiments, the method further includes attaching the first substrate with the epitaxial side down onto a carrier wafer using an adhesive layer. After attaching the first substrate with the epitaxial side down onto the carrier wafer, and in some embodiments, the method further includes removing the first substrate using a selective etchant to expose a back side of the at least partially processed QCL device that remains bonded to the carrier wafer. In some cases, after removing the first substrate, the method further includes bonding the at least partially processed QCL device to a second substrate along the back side of the at least partially processed QCL device. After bonding the at least partially processed QCL device to the second substrate, and in some examples, the method further includes removing the adhesive layer to detach the carrier wafer from the at least partially processed QCL device.

In yet another of the embodiments, discussed is a semiconductor device including a thermally conductive foreign substrate and a quantum cascade laser (QCL) heterostructure disposed over the thermally conductive foreign substrate. In some embodiments, the QCL heterostructure includes a lower cladding layer, an active region, and an upper cladding layer. Further, in various examples, the lower cladding layer is closer to the thermally conductive foreign substrate than the upper cladding layer. In some embodiments, the semiconductor device further includes a conductive bonding material interposing the thermally conductive foreign substrate and the QCL heterostructure. Additionally, in some embodiments, the semiconductor device includes a first contact and a second contact coupled for current injection through the QCL heterostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    providing a wafer including a native substrate and a plurality of epitaxial layers (epilayers) disposed over the native substrate, wherein the plurality of epilayers includes a quantum cascade laser (QCL) active region;
    before patterning the plurality of epilayers, performing a wafer-level epilayer-down bonding of the wafer to a foreign substrate having a thermal conductivity greater than that of silicon (Si), wherein the wafer-level epilayer-down bonding includes bonding a top epilayer of the plurality of epilayers face-down onto a top surface of the foreign substrate; and
    after performing the wafer-level epilayer-down bonding, removing the native substrate from the wafer, while the plurality of epilayers remains bonded to the foreign substrate.

2. The method of claim 1, wherein the plurality of epilayers includes a passive waveguide heterostructure for fabrication of QCL photonic integrated circuits.

3. The method of claim 1, wherein the foreign substrate includes at least one of SiC, AlN, diamond, and BeO.

4. The method of claim 1, wherein the foreign substrate has a thermal expansion coefficient within about +/−10% of that of the native substrate.

5. The method of claim 1, wherein the plurality of epilayers include unprocessed, semi-processed, or fully-processed QCL epilayers.

6. The method of claim 5, further comprising after removing the native substrate from the wafer, performing additional processing to the plurality of epilayers when the plurality of epilayers includes unprocessed or semi-processed QCL epilayers.

7. The method of claim 1, further comprising:
    after removing the native substrate from the wafer, using the plurality of epilayers to complete fabrication of a QCL device bonded to the foreign substrate; and
    dicing the QCL device bonded to the foreign substrate for mounting onto a heat sink.

8. The method of claim 1, wherein the native substrate includes an indium phosphide (InP) substrate.

9. The method of claim 1, wherein the performing the wafer-level epilayer-down bonding of the wafer to the foreign substrate includes performing a thermo-compression metal-metal bonding process.

10. The method of claim 9, wherein prior to performing the thermo-compression metal-metal bonding process, depositing a bonding material layer onto at least one of the top epilayer of the plurality of epilayers and the top surface of the foreign substrate.

11. The method of claim 10, wherein the bonding material layer includes gold (Au) or a Au-containing material layer.

12. The method of claim 1, wherein the providing the wafer further includes providing an etch stop layer disposed between the native substrate and the plurality of epilayers, and wherein the etch stop layer is removed after removing the native substrate.

13. A method, comprising:
    providing a first substrate including an at least partially processed quantum cascade laser (QCL) device disposed on a first side of the first substrate;
    attaching the first substrate including the at least partially processed QCL device with the first side of the first substrate face-down onto a carrier wafer using an adhesive layer;
    after attaching the first substrate onto the carrier wafer, removing the first substrate using a selective etchant to expose a back side of the at least partially processed QCL device that remains bonded to the carrier wafer;
    after removing the first substrate, performing a thermo-compression metal-metal bonding process, along the exposed back side of the at least partially processed QCL device, to bond the at least partially processed QCL device to a second substrate having a thermal conductivity greater than that of silicon (Si); and
    after performing the thermo-compression metal-metal bonding process, removing the adhesive layer using a solvent to detach the carrier wafer from the at least partially processed QCL device.

14. The method of claim 13, wherein the second substrate includes at least one of SiC, AlN, diamond, and BeO.

15. The method of claim 13, wherein the second substrate has a thermal expansion coefficient within about +/−10% of that of the first substrate.

16. The method of claim 13, further comprising:
    after removing the adhesive layer, performing further processing of the at least partially processed QCL device to form a completed QCL device bonded to the second substrate; and
    dicing the completed QCL device bonded to the second substrate for mounting onto a heat sink.

17. The method of claim 13, wherein the first substrate includes an indium phosphide (InP) substrate.

18. The method of claim 13, wherein the at least partially processed QCL device includes a QCL photonic integrated circuit including a QCL heterostructure and a passive waveguide heterostructure.

19. The method of claim 13, wherein prior to performing the thermo-compression metal-metal bonding process, depositing a metal bonding material layer onto at least one of the exposed back side of the at least partially processed QCL device and a top surface of the second substrate.

20. The method of claim 19, wherein the metal bonding material layer includes gold (Au) or a Au-containing material layer.

* * * * *